United States Patent
Hasunuma et al.

(10) Patent No.: US 10,173,883 B2
(45) Date of Patent: Jan. 8, 2019

(54) CONNECTOR, SOCKET, AND LIQUID STORING CONTAINER

(71) Applicant: Surpass Industry Co., Ltd., Saitama (JP)

(72) Inventors: Masahiro Hasunuma, Saitama (JP); Masamichi Kobayashi, Saitama (JP)

(73) Assignee: Surpass Industry Co., Ltd., Saitama (JP)

( * ) Notice: Subject to any disclaimer, the term of this patent is extended or adjusted under 35 U.S.C. 154(b) by 0 days.

(21) Appl. No.: 15/380,100

(22) Filed: Dec. 15, 2016

(65) Prior Publication Data

US 2017/0174498 A1    Jun. 22, 2017

(30) Foreign Application Priority Data

Dec. 17, 2015   (JP) ................................. 2015246448

(51) Int. Cl.
*B67D 7/02*      (2010.01)
*B65D 51/16*    (2006.01)
(Continued)

(52) U.S. Cl.
CPC ....... *B67D 7/0288* (2013.01); *B65D 51/1672* (2013.01); *B67D 7/0294* (2013.01); *B67D 1/0054* (2013.01); *H01L 21/30625* (2013.01)

(58) Field of Classification Search
CPC ................ B67D 7/0294; B67D 7/0216; H01L 21/30625; B65D 51/1672
See application file for complete search history.

(56) References Cited

U.S. PATENT DOCUMENTS 4,437,647 A *  3/1984  Cruse ................. F16L 37/23
                                                  251/149.9
6,568,427 B2 * 5/2003  Imai ..................... B67D 7/0283
                                                  137/590
(Continued)

FOREIGN PATENT DOCUMENTS

DE         4203785 A1    8/1993
JP       2009173326 A    8/2009
WO      2006110541 A2   10/2006

OTHER PUBLICATIONS

Filing receipt and specification for patent application entitled "Connector and Socket," by Masahiro Hasunuma, et al., filed Dec. 15, 2016 as U.S. Appl. No. 15/380,072.
Foreign Communication from a related application—Extended European Search Report of European Application No. 16203190.0, dated May 10, 2017, 10 pages.
(Continued)

*Primary Examiner* — Craig Schneider
*Assistant Examiner* — Kevin Barss
(74) *Attorney, Agent, or Firm* — Conley Rose, P.C.; Keith C. Rawlins

(57) ABSTRACT

Provided is a connector including a plug to be fixed to an inner peripheral surface of an opening of a liquid storing container, and a socket to be detachably attached to the plug. The plug includes a plug body including, formed therein, a first liquid outflow passage, a first liquid inflow passage, and a first gas passage. The socket includes: a socket body including, formed therein, a second liquid outflow passage, a second liquid inflow passage, and a second gas passage; and a ball lock mechanism that allows lock balls to be engaged with engagement grooves formed along a circumferential direction about an axial line in an outer peripheral surface of the opening of the liquid storing container and fixes the lock balls to the engagement grooves.

8 Claims, 14 Drawing Sheets

(51) Int. Cl.
    *H01L 21/306*    (2006.01)
    *B67D 1/00*      (2006.01)

(56) References Cited

U.S. PATENT DOCUMENTS

| | | | | |
|---|---|---|---|---|
| 6,886,804 B2* | 5/2005 | Doi | ................ | F16L 37/23 |
| | | | | 251/149.1 |
| 8,052,014 B2* | 11/2011 | Hasegawa | ............ | B67D 7/0261 |
| | | | | 137/212 |
| 8,302,618 B2* | 11/2012 | Takanohashi | ........ | B67D 7/0283 |
| | | | | 137/212 |
| 8,381,768 B2* | 2/2013 | Hasegawa | ............ | B67D 7/0261 |
| | | | | 137/212 |
| 8,870,037 B2 | 10/2014 | Takanohashi | | |
| 9,010,352 B2* | 4/2015 | Takanohashi | ........ | B67D 7/0294 |
| | | | | 137/145 |
| 9,126,713 B2* | 9/2015 | Takanohashi | ........ | B67D 7/0294 |
| 9,157,459 B2 | 10/2015 | Hasunuma et al. | | |
| 9,517,925 B2 | 12/2016 | Imai et al. | | |
| 2002/0020449 A1 | 2/2002 | Imai | | |
| 2006/0243755 A1 | 11/2006 | Hennen et al. | | |
| 2008/0251545 A1* | 10/2008 | O'Leary | .................. | B67B 7/24 |
| | | | | 222/464.1 |
| 2009/0188919 A1 | 7/2009 | Takanohashi | | |
| 2011/0100481 A1* | 5/2011 | Takanohashi | ........ | B67D 7/0294 |
| | | | | 137/315.01 |

OTHER PUBLICATIONS

Notice of Allowance of U.S. Appl. No. 15/380,072 dated Feb. 26, 2018 (12 pages).

* cited by examiner

CONNECTOR, SOCKET, AND LIQUID STORING CONTAINER

CROSS-REFERENCE TO RELATED APPLICATIONS

This application is based on Japanese Patent Application No. 2015-246448, the contents of which are incorporated herein by reference in its entirety.

TECHNICAL FIELD

The present disclosure relates to a connector, a socket, and a liquid storing container.

BACKGROUND ART

A plug and a socket that are attached to a container for storing a liquid, such as a chemical solution, which is used for semiconductor production, are conventionally known (for example, see Japanese Unexamined Patent Application, Publication No. 2009-173326).

The plug disclosed in Japanese Unexamined Patent Application, Publication No. 2009-173326 is press-fit into an opening of the liquid storing container and thus is attached to the opening of the liquid storing container. The socket disclosed in Japanese Unexamined Patent Application, Publication No. 2009-173326 includes a sleeve having an inside screw formed therein. The inside screw of the sleeve is fastened to an outside screw, which is formed on the outside of the opening of the liquid storing container, to thereby attach the socket to the outside of the opening of the liquid storing container.

SUMMARY

Technical Problem

However, in the socket disclosed in Japanese Unexamined Patent Application, Publication No. 2009-173326, when the socket is attached to the opening of the liquid storing container in which the plug is attached, there is a need to rotate the sleeve in a state where the socket is inserted into the plug to thereby fasten the inside screw to the outside screw at the opening. Further, when the socket disclosed in Japanese Unexamined Patent Application, Publication No. 2009-173326 is detached from the opening of the liquid storing container, there is a need to rotate the sleeve and release the state in which the inside screw is fastened to the outside screw at the opening.

Thus, the socket disclosed in Japanese Unexamined Patent Application, Publication No. 2009-173326 requires such a troublesome operation that the sleeve is rotated when the socket is attached to the opening of the liquid storing container.

Further, the state in which the inside screw of the sleeve and the outside screw formed at the opening of the liquid storing container are fastened is confirmed based on a judgment by an operator. Accordingly, the judgment on the fastened state differs from operator to operator, so that there is a possibility that the inside screw of the sleeve and the outside screw formed at the opening of the liquid storing container are not completely fastened.

The present disclosure has been made in view of the above-mentioned circumstances, and an object of the present disclosure is to provide a connector including a socket that can be reliably attached to a plug without requiring any troublesome operation. Another object of the present disclosure is to provide a socket that can be reliably attached to a plug without requiring any troublesome operation. Still another object of the present disclosure is to provide a liquid storing container which is applied to a socket that can be reliably attached to a plug without requiring any troublesome operation.

Solution to Problem

To solve the above-mentioned problem, the present disclosure adopts the following solutions.

A connector according to one aspect of the present disclosure is a connector to be attached to a liquid storing container having an opening formed in an upper surface thereof, the opening being formed with a cylindrical shape about a first axial line, the connector including: a plug to be fixed to an inner peripheral surface of the opening; and a socket to be detachably attached to the plug. The plug includes a plug body including, formed therein, a first liquid outflow passage through which a liquid stored in the liquid storing container is drawn out; a first liquid inflow passage that guides the liquid flowing in from an outside of the liquid storing container into the liquid storing container; and a first gas passage that circulates an outside air between an inside space of the liquid storing container and an outside space of the liquid storing container. The socket includes: a socket body including, formed therein, a second liquid outflow passage through which the liquid drawn out from the first liquid outflow passage is caused to flow to the outside; a second liquid inflow passage that guides the liquid flowing in from the outside of the liquid storing container to the first liquid inflow passage; and a second gas passage connected to the first gas passage and causing the outside air to circulate between the inside space and the outside space; and a ball lock mechanism that is attached to the socket body, allows a plurality of lock balls to be engaged with engagement grooves, and fixes the plurality of lock balls to the engagement grooves, respectively, the engagement grooves being formed along a circumferential direction about the first axial line in an outer peripheral surface of the opening.

In the connector according to one aspect of the present disclosure, for example, the liquid is sucked by an external pump in a state where the socket is attached to the plug, and the liquid drawn out from the first liquid outflow passage of the plug flows to the outside via the second liquid outflow passage of the socket. Further, the liquid circulated by the external pump is guided from the first liquid inflow passage of the plug into the liquid storing container via the second liquid inflow passage of the socket. Furthermore, an outside air to be replaced by an amount corresponding to the decreased amount of liquid stored in the liquid storing container is guided from the outside space of the liquid storing container into the inside space thereof via the second gas passage of the socket and the first gas passage of the plug.

In this manner, the connector according to one aspect of the present disclosure has a structure capable of causing the liquid stored in the liquid storing container to flow to the outside, causing the liquid that has flown to the outside and circulated to flow into the liquid storing container, and introducing an outside air corresponding to the decreased amount of liquid stored in the liquid storing container.

Further, the socket included in the connector according to one aspect of the present disclosure can be reliably attached to the plug without requiring any troublesome operation, because the ball lock mechanism allows the plurality of lock balls to be engaged with the engagement grooves formed in the outer peripheral surface of the opening of the liquid storing container and fixes the plurality of lock balls to the engagement grooves, respectively.

In the connector according to one aspect of the present disclosure, the ball lock mechanism may include: the plurality of lock balls; a first cylindrical member having a plurality of opening holes, the opening holes being formed with a cylindrical shape about the first axial line and having a diameter smaller than an outer diameter of each of the lock balls; a second cylindrical member that is formed with a cylindrical shape about the first axial line and disposed at an outer peripheral side of the first cylindrical member, the second cylindrical member including a regulating portion that regulates the lock balls stored in the opening holes, respectively, to be engaged with the engagement grooves; and an urging force generation unit that urges the second cylindrical member against a location where the regulating portion contacts the lock balls, one end of the urging force generation unit being formed along the first axial line and fixed to the first cylindrical member, the other end of the urging force generation unit being formed along the first axial line and fixed to the second cylindrical member.

According to the connector having the structure as described above, when the socket is attached to the opening of the liquid storing container in which the plug is fixed to the inner peripheral surface thereof, the operator causes the second cylindrical member to be pulled upward along the first axial line and withdrawn so as to prevent the regulating portion from contacting the lock balls. This allows the operator to attach the socket to the plug in a state where the locking by the ball lock mechanism is released.

Further, the operator detaches the second cylindrical member after attaching the socket to the plug, thereby allowing the socket to be fixed to the outer peripheral surface of the opening without requiring any troublesome operation. This is because when the second cylindrical member is detached, the urging force from the urging force generation unit is applied to the second cylindrical member and the regulating portion moves to the location where the regulating portion contacts the lock balls, thereby allowing the plurality of lock balls to be fixed to the engagement grooves, respectively.

Further, according to the connector having the structure as described above, when the operator attaches the socket to the opening of the liquid storing container in which the plug is fixed to the inner peripheral surface thereof, the operator presses the socket into the plug without touching the second cylindrical member, thereby allowing the lock balls to be withdrawn. This is because the force of pressing the socket by the operator becomes a force against the urging force of the urging force generation unit, which causes the second cylindrical member to be moved so that the lock balls can be withdrawn.

Then, the operator presses the socket into the plug until the lock balls reach the location of the engagement grooves, thereby allowing the lock balls to be fixed to the engagement grooves, respectively, by the urging force of the urging force generation unit. This operation allows the operator to fix the socket to the outer peripheral surface of the opening without requiring any troublesome operation.

In the connector having the structure as described above, the ball lock mechanism may include a rotation regulating mechanism that regulates a rotation of the second cylindrical member about the first axial line with respect to the first cylindrical member.

This structure makes it possible to prevent such a defect that the second cylindrical member is rotated about the first axial line with respect to the first cylindrical member and the urging force applied to the second cylindrical member by the urging force generation unit changes.

In the connector having the structure as described above, the socket body may include a cylindrical insertion hole formed along a second axial line intersecting with the first axial line so as to penetrate through the second liquid outflow passage and the second liquid inflow passage, and the socket may include: a columnar rotary valve including an outflow through-hole and an inflow through-hole and inserted into the insert hole, the outflow through-hole being formed at a location where the second liquid outflow passage is disposed on the second axial line, the inflow through-hole being formed at a location where the second liquid inflow passage is disposed on the second axial line; and a switching mechanism that switches between an open state and a closed state when the rotary valve is rotated about the second axial line, the open state being a state in which the outflow through-hole and the second liquid outflow passage communicate with each other and the inflow through-hole and the second liquid inflow passage communicate with each other, the closed state being a state in which the outflow through-hole and the second liquid outflow passage do not communicate with each other and the inflow through-hole and the second liquid inflow passage do not communicate with each other.

The structure for switching the liquid circulation state by bringing a valve body, which is disposed at the socket, and a valve seat, which is disposed at the plug, into contact with each other or separating them from each other, has a section where the passage sectional area decreases locally and includes an urging mechanism for urging the valve body into the closed state. Accordingly, when the liquid is a slurry containing an abrasive or the like (a slurry in which solid particles are dispersed), the solid particles adhere to the section where the passage sectional area decreases locally, which deteriorates the liquidity of the liquid. Further, when the solid particles adhere to the urging mechanism of the valve body and are coagulated, the valve body cannot be opened or closed smoothly.

On the other hand, in the connector according to the above aspect, the switching mechanism switches the rotary valve to the open state or the closed state, thereby making it possible to switch between the open state and the closed state. The open state is a state in which the liquid is circulated in the second liquid outflow passage and the second liquid inflow passage via the outflow through-hole and the inflow through-hole. The closed state is a state in which the liquid is not circulated in the second liquid outflow passage and the second liquid inflow passage via the outflow through-hole and the inflow through-hole.

Therefore, it is possible to prevent such a defect that the solid particles accumulate at the section where the passage sectional area decreases locally, which deteriorates the liquidity of the liquid. Further, since the urging mechanism that allows the valve body to be opened or closed by the urging force is not placed within the passage, it is possible to prevent such a defect that the solid particles accumulate on the urging mechanism, which makes it difficult to smoothly open or close the valve.

In the connector according to the above aspect, the switching mechanism may include a lock member that regulates an upward movement of the second cylindrical member along the first axial line in the open state.

The urging force generation unit urges the second cylindrical member against the location where the regulating portion contacts the lock balls. Accordingly, the ball lock mechanism allows the socket to be fixed to the outer peripheral surface of the opening. However, if the second cylindrical member is pulled upward due to an erroneous operation or the like, the socket may be detached from the outer peripheral surface of the opening. If the socket is detached from the outer peripheral surface of the opening in the open state of the rotary valve, the liquid may flow to the outside.

In the connector according to the above aspect, since the upward movement of the second cylindrical member is regulated in the open state of the rotary valve, the regulating portion is prevented from being separated from the lock balls and thus the socket is prevented from being detached from the outer peripheral surface of the opening. This structure makes it possible to reliably prevent the liquid from flowing to the outside due to an erroneous operation or the like.

In the connector according to one aspect of the present disclosure, the plug may include: a cylindrical inside pipe that is attached to a lower portion of the plug body and guides the liquid stored in the liquid storing container to the first liquid outflow passage; a cylindrical outside pipe that is attached to the plug body, is disposed at an outside of the inside pipe, and forms an annular passage to guide the liquid guided to the first liquid inflow passage into the liquid storing container; and a sealing member that seals a space between an outer peripheral surface of the inside pipe and an inner peripheral surface at a second lower end of the outside pipe, the second lower end being disposed above a first lower end of the inside pipe. An outflow hole through which the liquid is caused to flow out into the liquid storing container from the annular passage may be formed at the second lower end of the outside pipe.

According to the connector having the structure as described above, the liquid guided to the first liquid inflow passage formed in the plug body is guided to the annular passage formed between the inside pipe and the outside pipe, and flows out into the liquid storing container from the outflow hole formed at the second lower end of the outside pipe. Since the liquid flows out from the outflow hole formed at the second lower end of the outside pipe, the liquid flows out in the direction in which the outflow hole is opened, and thus the liquid flows favorably in the vicinity of the bottom of the liquid storing container. Accordingly, when the liquid is a slurry containing an abrasive or the like (a slurry in which solid particles are dispersed), the state in which the solid particles and the liquid are favorably mixed in the vicinity of the bottom of the liquid storing container is maintained.

A socket according to one aspect of the present disclosure is a socket to be attached to a liquid storing container having an opening formed in an upper surface thereof, the opening being formed with a cylindrical shape about an axial line, the socket including: a socket body including, formed therein, a liquid outflow passage that causes a liquid drawn out from a plug to be fixed to an inner peripheral surface of the opening to flow to an outside of the liquid storing container; a liquid inflow passage that guides the liquid flowing in from the outside of the liquid storing container to the plug; and a gas passage that circulates an outside air between an inside space of the liquid storing container and an outside space of the liquid storing container; and a ball lock mechanism that allows a plurality of lock balls to be engaged with engagement grooves and fixes the plurality of lock balls to the engagement grooves, respectively, the engagement grooves being formed along a circumferential direction about the axial line in an outer peripheral surface of the opening.

In the socket according to one aspect of the present disclosure, the liquid is sucked by an external pump in a state where the socket is attached to the plug, and the liquid drawn out from the plug flows to the outside via the liquid circulation passage. Further, the liquid circulated by the external pump is guided from the plug into the liquid storing container via the liquid inflow passage. Furthermore, an outside air to be replaced by an amount corresponding to the decreased amount of liquid stored in the liquid storing container is guided from the outside space of the liquid storing container into the inside space thereof via the gas passages and the plug.

In this manner, the socket according to one aspect of the present disclosure has a structure capable of causing the liquid stored in the liquid storing container to flow to the outside, causing the liquid that has flown to the outside and circulated to flow into the liquid storing container, and introducing an outside air corresponding to the decreased amount of liquid stored in the liquid storing container.

In the socket according to one aspect of the present disclosure, the ball lock mechanism allows the plurality of lock balls to be engaged with the engagement grooves, which are formed in the outer peripheral surface of the opening of the liquid storing container, and fixes the plurality of lock balls to the engagement grooves, respectively, thereby making it possible to reliably attach the socket to the plug without requiring any troublesome operation.

A liquid storing container according to one aspect of the present disclosure includes: a container body that stores a liquid; and an opening that is provided in an upper surface of the container body and formed with a cylindrical shape about an axial line, the liquid storing container being attachable to a connector, the connector including: a plug to be fixed to an inner peripheral surface of the opening; and a socket to be detachably attached to the plug. Engagement grooves to be engaged with a plurality of lock balls are formed along a circumferential direction about the axial line in an outer peripheral surface of the opening, the plurality of lock balls being included in a ball lock mechanism provided in the socket.

With this structure, it is possible to provide the liquid storing container that allows the socket including the ball lock mechanism to be appropriately engaged.

Advantageous Effects

According to the present disclosure, it is possible to provide a connector including a socket that can be reliably attached to a plug without requiring any troublesome operation. Further, it is possible to provide a socket that can be reliably attached to a plug without requiring any troublesome operation. Furthermore, it is possible to provide a liquid storing container which is applied to a socket that can be reliably attached to a plug without requiring any troublesome operation.

DESCRIPTION OF EMBODIMENTS

A liquid supply system according to an embodiment of the present disclosure will be described below with reference to the drawings.

Figure 1:
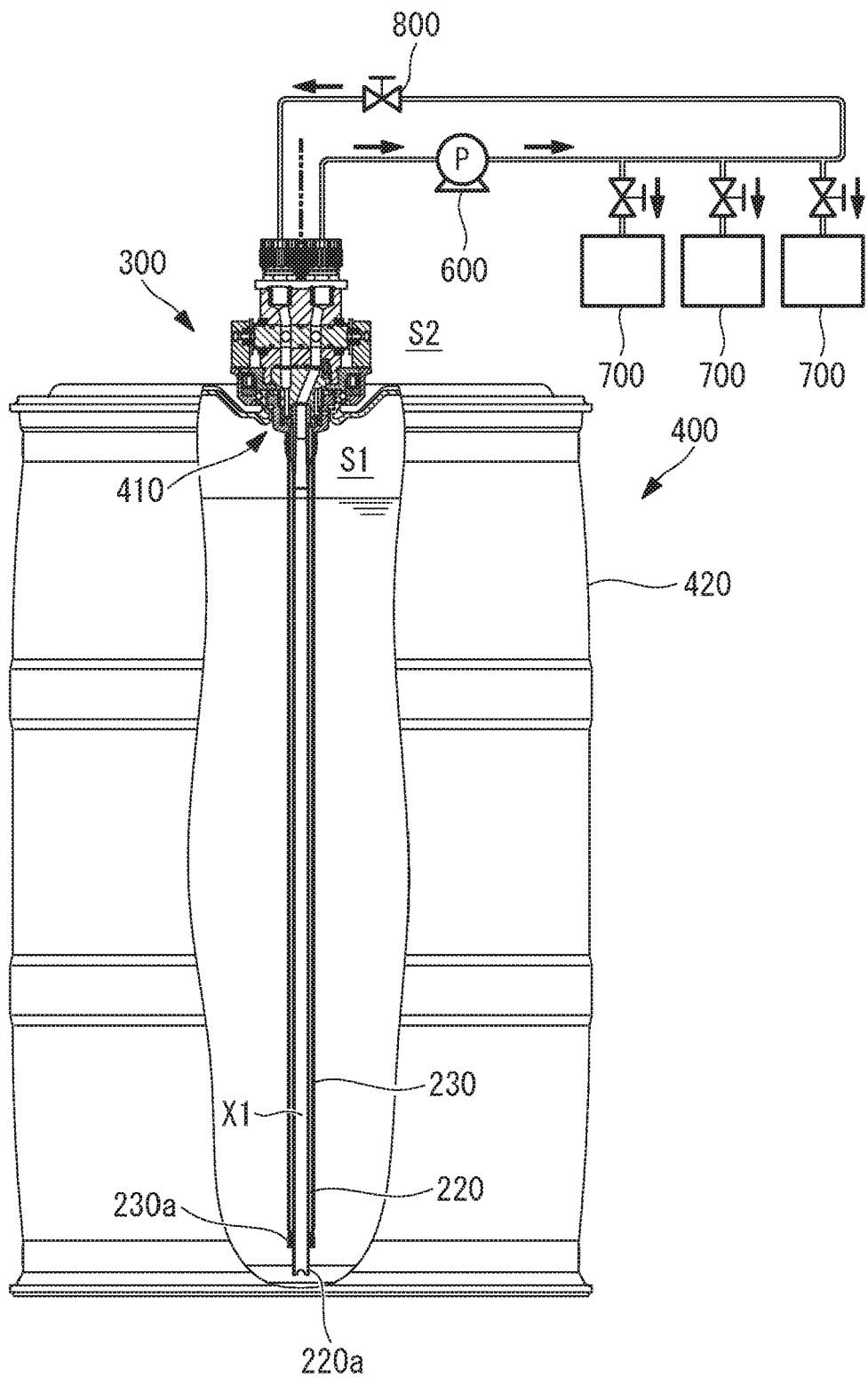
FIG. 1 is a structural diagram showing a liquid supply system according to an embodiment of the present disclosure.

The liquid supply system according to this embodiment shown in FIG. 1 is a system in which a liquid stored in a liquid storing container 400 is sucked by a pump 600 and the sucked liquid is supplied to a plurality of supply destination devices 700.

The amount of liquid to be supplied to each supply destination device 700 is adjusted by a flow rate regulating valve which is provided at the supply destination device 700. In the liquid sucked by the pump 600, the remaining liquid which has not been supplied to each supply destination device 700 is returned to the liquid storing container 400 again via a circulation amount regulating valve 800.

In this manner, the liquid supply system according to this embodiment supplies part of the liquid drawn out from the liquid storing container 400 to each supply destination device 700, and causes the remaining liquid to return to the liquid storing container 400 again for circulation. This structure is intended to prevent solid particles from settling at the bottom of the liquid storing container 400, because the liquid stored in the liquid storing container 400 is a slurry in which solid particles are dispersed.

Note that the flow rate of the liquid to be circulated by the liquid supply system is adjusted by the aperture of the circulation amount regulating valve 800.

The slurry used as the liquid in this embodiment is, for example, a liquid containing a silica-based or ceria-based polishing agent used for chemical mechanical polishing which is a wafer polishing method to be employed during semiconductor production.

As shown in FIG. 1, the liquid storing container 400 included in the liquid supply system according to this embodiment includes a container body 420 that stores the liquid, and an opening 410 that is disposed at the upper surface of the container body 420 and is formed with a cylindrical shape about an axial line X1 (first axial line).

As shown in FIG. 1, the liquid supply system according to this embodiment includes a connector 300 to be attached to the opening 410 of the liquid storing container 400. The connector 300 is a device including: a liquid outflow passage that draws out the liquid stored in the liquid storing container 400 and supplying the liquid to the pump 600; a liquid inflow passage that allows the liquid, which has passed through the circulation amount regulating valve 800, to be returned to the liquid storing container 400; and a gas passage that introduces an outside air corresponding to the decreased amount of liquid from the liquid storing container 400. According to the connector 300 of this embodiment, the outflow of the liquid, the inflow of the liquid, and the replacement of the outside air corresponding to the decreased amount of liquid can be achieved by one device which is attached to the opening 410 at one section.

The connector 300 according to this embodiment will be described below with reference to the drawings.

Figure 2:
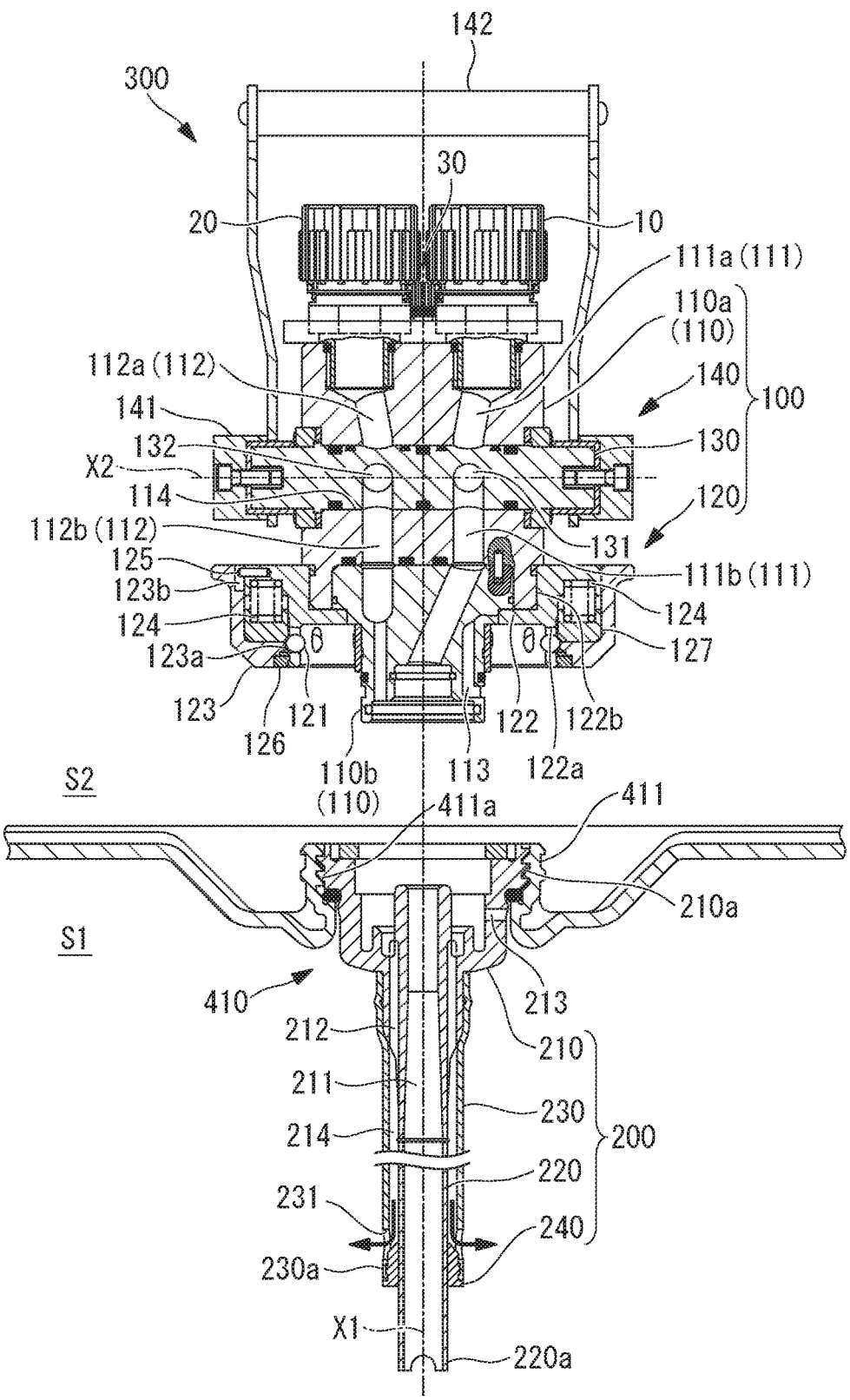
FIG. 2 is a partial longitudinal sectional view of a connector in a state where a socket is spaced apart from a plug as viewed from the front side.
Figure 3:
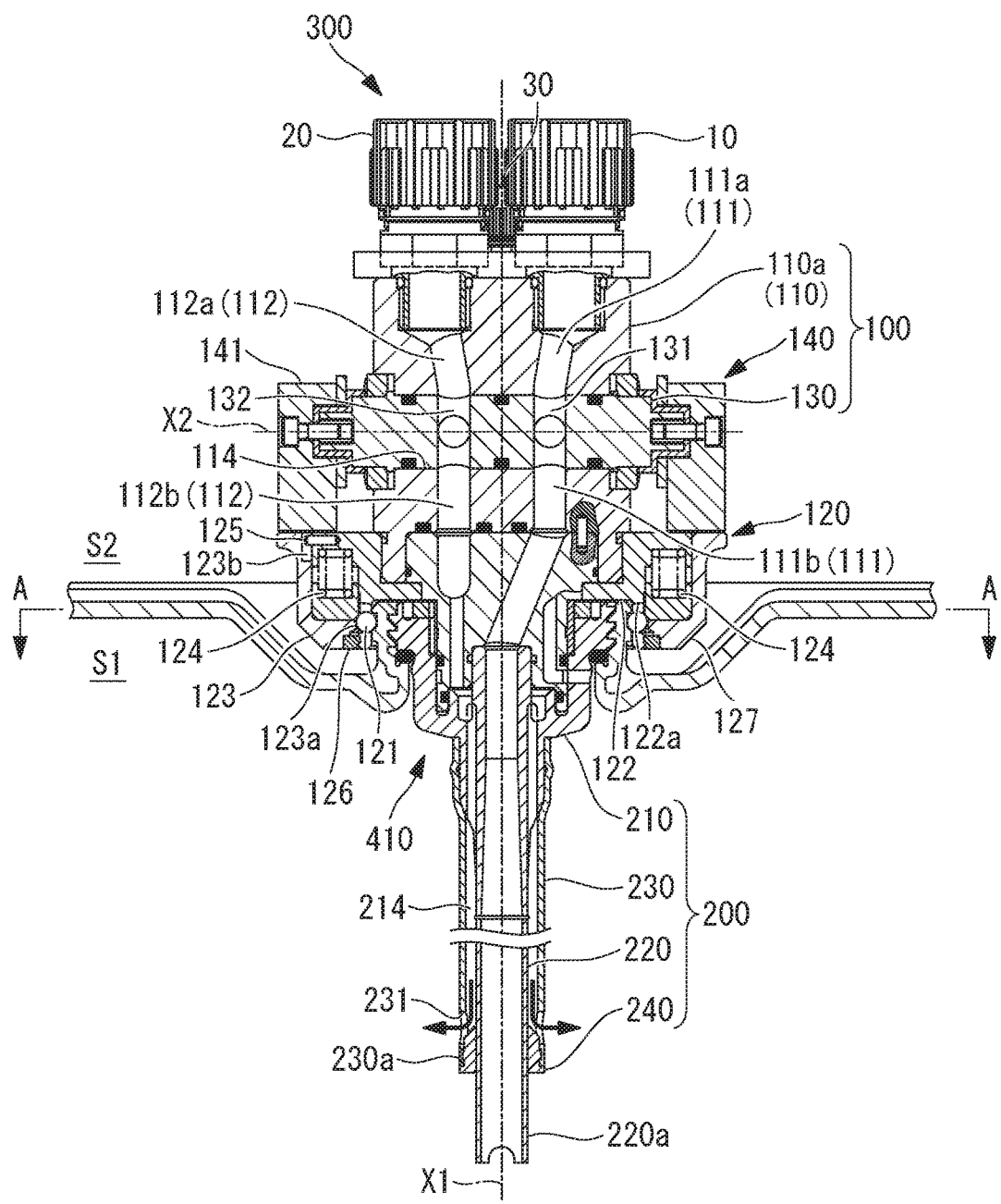
FIG. 3 is a partial longitudinal sectional view of the connector in a state where the socket is attached to the plug as viewed from the front side.

As shown in FIGS. 2 and 3, the connector 300 according to this embodiment includes a plug 200 and a socket 100. The plug 200 is fixed to a female screw 411a that is formed in the inner peripheral surface of the opening 410 formed in the upper surface of the liquid storing container 400. The socket 100 is detachably attached to the plug 200.

FIG. 2 shows a state where the socket 100 is spaced apart from the plug 200, and FIG. 3 shows a state where the socket 100 is attached to the plug 200.

The plug 200 included in the connector 300 according to this embodiment will be described.

As shown in FIG. 2, the plug 200 includes: a plug body 210; an inside pipe 220 which is attached to a lower portion of the plug body 210 and is formed with a cylindrical shape about the axial line X1; an outside pipe 230 which is attached to the plug body 210 and has a cylindrical shape; and a sealing member 240 for sealing the space between the outside pipe 230 and the inside pipe 220.

Each member constituting the plug 200 is formed of a fluorine-contained resin material, such as PFA (tetrafluoroethylene perfluoroalkylvinylether copolymer), or a crystalline thermoplastic resin such as HDPE (high-density polyethylene).

The plug body 210 is a member that is formed with a substantially cylindrical shape about the axial line X1 and has a male screw 210a that is formed on the outer peripheral surface at an upper end thereof. The male screw 210a of the plug body 210 is fastened to the female screw 411a, which is formed in the inner peripheral surface of the opening 410, thereby fixing the plug body 210 to the inner peripheral surface of the opening 410.

In the plug body 210, a first liquid outflow passage 211, a first liquid inflow passage 212, and a first gas passage 213 are formed.

The first liquid outflow passage 211 is a guide passage that draws out the liquid stored in the liquid storing container 400 and guides the liquid to the discharge port 10. The first liquid inflow passage 212 is a passage that guides the liquid flowing in from the outside of the liquid storing container 400 via the inflow port 20 into the liquid storing container 400. The first gas passage 213 is a passage that circulates an outside air between an inside space S1 of the liquid storing container 400 and an outside space S2 of the liquid storing container 400.

The inside pipe 220 is a member that is formed with a cylindrical shape along the axial line X1. As shown in FIG. 1, in the state where the plug 200 is attached to the opening 410 of the liquid storing container 400, a lower end (first lower end) 220*a* of the inside pipe 220 is disposed in the vicinity of the bottom of the liquid storing container 400.

The inside pipe 220 is attached to a lower end of the plug body 210 by heat welding and guides the liquid stored in the liquid storing container 400 to the first liquid outflow passage 211 of the plug body 210.

The outside pipe 230 is a member that is formed with a cylindrical shape along the axial line X1. As shown in FIGS. 1 and 2, in the state where the plug 200 is attached to the opening 410 of the liquid storing container 400, a lower end (second lower end) 230*a* of the outside pipe 230 is disposed above the lower end 220*a* of the inside pipe 220.

The outside pipe 230 is attached to the outer peripheral surface below the plug body 210 by press fitting and is disposed on the outside of the inside pipe 220. Between the outer peripheral surface of the inside pipe 220 and the inner peripheral surface of the outside pipe 230, a circular passage 214 for guiding the liquid, which has been guided to the first liquid inflow passage 212 of the plug body 210, into the liquid storing container 400 is formed.

At the lower end 230*a* of the outside pipe 230, a plurality of outflow holes 231 through which the liquid is caused to flow out of the circular passage 214 into the liquid storing container 400 are formed at a plurality of sections (for example, four sections at an interval of 90°) about the axial line X1.

The sealing member 240 is a member for sealing the space between the outer peripheral surface of the inside pipe 220 and the inner peripheral surface of the lower end 230*a* of the outside pipe 230. The sealing member 240 prevents the liquid flowing from the circular passage 214 from being directly guided to the bottom surface of the liquid storing container 400 along the axial line X1. Since the lower end of the circular passage 214 is sealed by the sealing member 240, the liquid which has reached the lower end of the circular passage 214 flows out into the liquid storing container 400 through the outflow hole 231 as indicated by arrows shown in FIG. 2.

The liquid falling from the upper position to the lower position along the circular passage 214 flows out horizontally (in a direction perpendicular to the axial line X1) from the plurality of outflow holes 231. Accordingly, the liquid flows out in a plurality of directions in which the plurality of outflow holes 231 are opened, so that the liquid in the vicinity of the bottom surface of the liquid storing container 400 flows favorably. Accordingly, when the liquid is a slurry containing a polishing agent or the like (a slurry in which solid particles are dispersed), the state in which the solid particles and the liquid are favorably mixed in the vicinity of the bottom surface of the liquid storing container 400 is maintained.

In the above description, the plurality of outflow holes 231 are formed at the lower end 230*a* of the outside pipe 230. Alternatively, a single outflow hole 231 may be formed at the lower end 230*a* of the outside pipe 230.

The socket 100 included in the connector 300 according to this embodiment will be described below.

As shown in FIG. 2, the socket 100 includes a socket body 110, a lock ball mechanism 120, which is attached to the socket body 110, a columnar rotary valve 130, which is inserted into a columnar insert hole 114 formed in the socket body 110, and a switching mechanism 140 that rotates the rotary valve 130 about an axial line X2 (second axial line).

Figure 10:
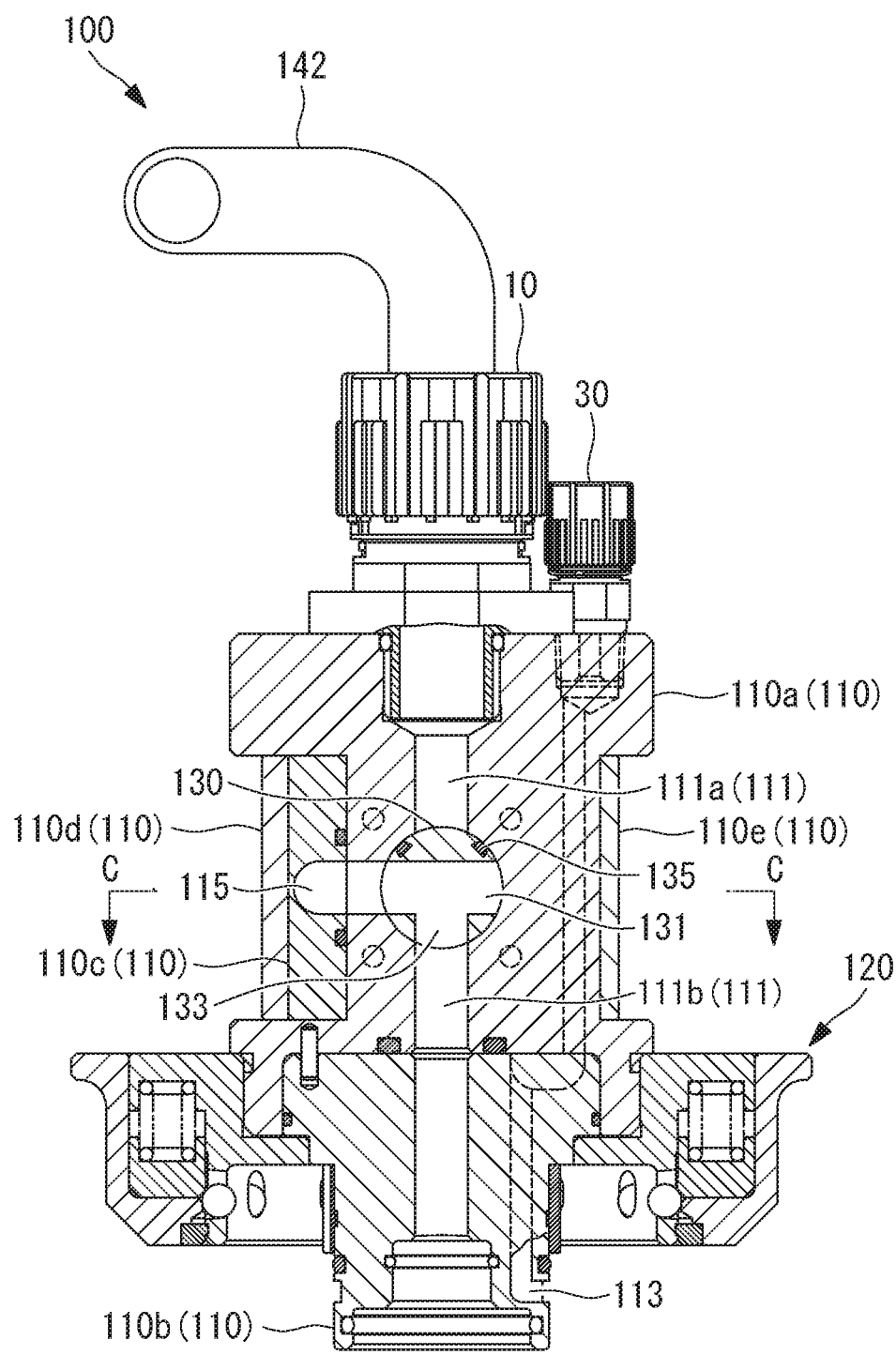
FIG. 10 is a partial sectional view of the socket as viewed along a line B-B shown in FIG. 9.
Figure 11:
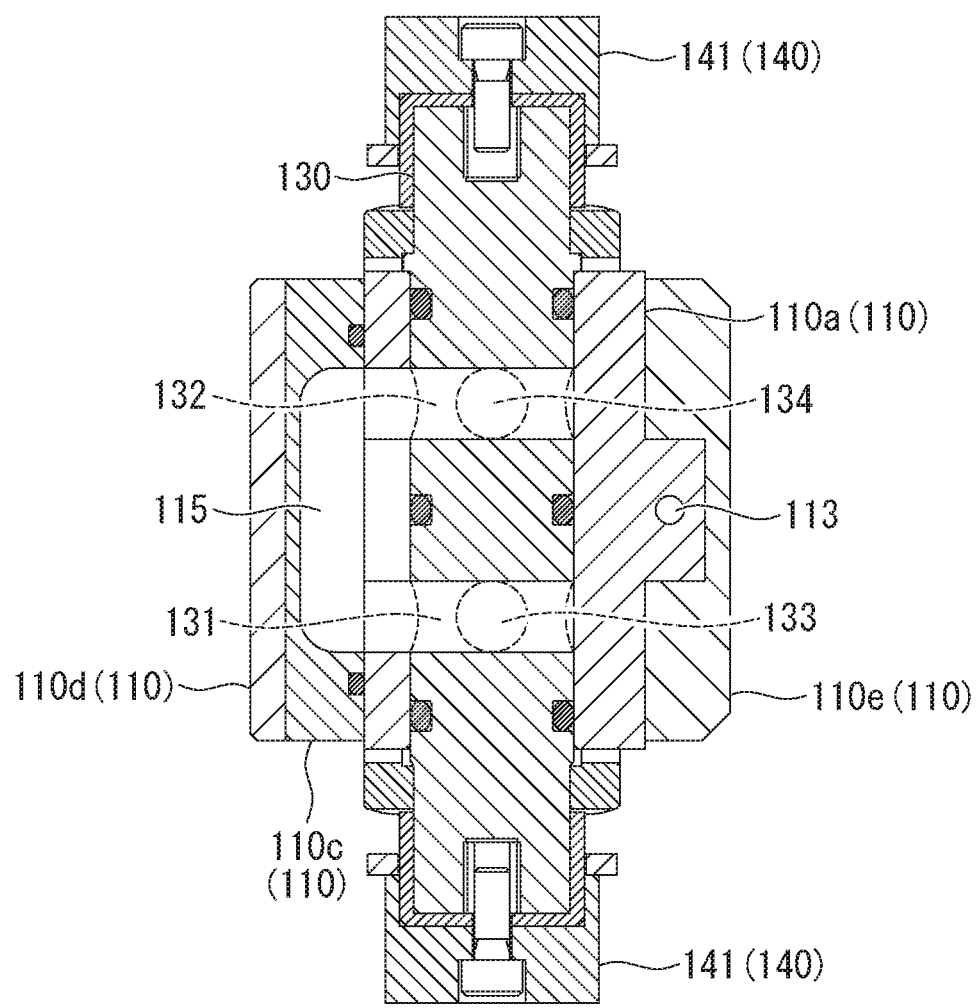
FIG. 11 is an end view of the socket as viewed along a line C-C shown in FIG. 10.

The socket body 110 is a member that is formed with a substantially cylindrical shape about the axial line X1. The socket body 110 includes, at an upper end thereof, a first body portion 110*a* to which the discharge port 10 and the inflow port 20 are attached, and also includes, at a lower end thereof, a second body portion 110*b* into which the plug 200 is inserted. Further, as shown in FIGS. 10 and 11 to be described later, the socket body 110 includes a communication member 110*c*, a plate-like member 110*d*, and a plate-like member 110*e*.

The second body portion 110*b* is fixed by the socket member 122 of the lock ball mechanism 120, which is described later, in the state where the second body portion 110*b* is inserted into the lower end of the first body portion 110*a*.

In the socket body 110, a second liquid outflow passage 111, a second liquid inflow passage 112, and a second gas passage 113 are formed.

The second liquid outflow passage 111 is a passage that causes the liquid to be drawn out from the first liquid outflow passage 211 via the discharge port 10 to the outside. The second liquid inflow passage 112 is a passage that guides the liquid flowing in from the outside of the liquid storing container 400 via the inflow port 20 to the first liquid inflow passage 212. The second gas passage 113 is a passage that is connected to the first gas passage 213 and allows an outside air to circulate between the inside space Si of the liquid storing container 400 and the outside space S2 of the liquid storing container 400 via a vent port 30.

The lock ball mechanism 120 is a mechanism for allowing a plurality of lock balls 121 to be engaged with engagement grooves 411, which are formed along the circumferential direction about the axial line X1 in the outer peripheral surface of the opening 410 of the liquid storing container 400, and then fixing the plurality of lock balls 121 to the engagement grooves 411. The socket body 110 is fixed to the opening 410 of the liquid storing container 400 by the lock ball mechanism 120 in a state where the socket 100 and the plug 200 are attached.

As shown in FIG. 2, the lock ball mechanism 120 includes a plurality of lock balls 121, a socket member (first cylindrical member) 122, a sleeve (second cylindrical member) 123, a spring (urging force generation unit) 124, a rotation regulating pin (rotation regulating mechanism) 125, a stop ring 126, and a spring receiving member 127.

The socket member 122 is a member that is formed with a cylindrical shape about the axial line X1 and has a plurality of opening holes 122*a* having a diameter smaller than the outer diameter of the spherical lock balls 121. As shown in FIGS. 2 and 3, the plurality of lock balls 121 are respectively stored in the plurality of opening holes 122*a* of the socket member 122. However, the outer diameter of each lock ball 121 is larger than the diameter of the opening hole 122*a*, which prevents the lock balls 121 from being completely removed from the opening hole 122*a* to the inner peripheral side of the socket member 122.

The socket member 122 is fixed to the socket body 110 in such a manner that the female screw 122*b* formed in the inner peripheral surface is fastened to the male screw formed on the outer peripheral surface of the first body portion 110*a* of the socket body 110.

The sleeve 123 is a member that is formed with a cylindrical shape about the axial line X1 and is disposed on the outer peripheral side of the socket member 122. The upper end position of the sleeve 123 is regulated by the socket member 122, and the lower end position of the sleeve 123 is regulated by the circular stop ring 126 which is attached to the outer peripheral surface on the lower end side of the socket member 122. The sleeve 123 is movable relative to the socket member 122 between the lower end position and the upper end position of the socket member along the axial line X1.

The sleeve 123 has a regulating portion 123*a* that regulates the plurality of lock balls 121 accommodated in the opening holes 122*a* to be engaged with the engagement grooves 411 of the opening 410.

The spring 124 is an elastic member having an upper end (one end) that is formed along the axial line X1 and fixed to the socket member 122, and having a lower end (the other end) that is formed along the axial line X1 and fixed to the sleeve 123 via the spring receiving member 127. The spring 124 generates an urging force by elastic deformation, and urges the sleeve 123 against the lower end position where the regulating portion 123*a* of the sleeve 123 contacts the lock balls 121. The springs 124 are arranged at a plurality of sections at regular intervals in the circumferential direction (for example, six sections at an interval of 60°) about the axial line X1. The arrangement of the springs 124 at the plurality of sections at regular intervals makes it possible to supply the sleeve 123 to be supplied with a uniform urging force.

In this case, the spring receiving member 127 is a member that is formed with a circular shape about the axial line X1, and has opening holes for storing the springs 124 that are formed at a plurality of sections.

While the springs 124 are provided at the plurality of sections at regular intervals in the circumferential direction about the axial line X1 in this embodiment. Alternatively, a single spring having the same diameter as that of the spring receiving member 127 may be provided about the axial line X1.

The rotation regulating pin 125 is a member that regulates the rotation of the sleeve 123 about the axial line X1 with respect to the socket member 122. The rotation regulating pin 125 has one end fixed to the outer peripheral surface of the socket member 122, and the other end inserted into a rotation regulating groove (rotation regulating mechanism) 123*b* that is formed along the axial line X1 in the inner peripheral surface of the sleeve 123. The rotation regulating mechanism composed of the rotation regulating pin 125 and the rotation regulating groove 123*b* regulates the rotation of the sleeve 123 about the axial line X1 with respect to the socket member 122, and allows the sleeve 123 to move along the axial line X1 with respect to the socket member 122.

An operation for fixing the socket 100 to the opening 410 of the liquid storing container 400 by using the lock ball mechanism 120 will now be described.

Figure 4:
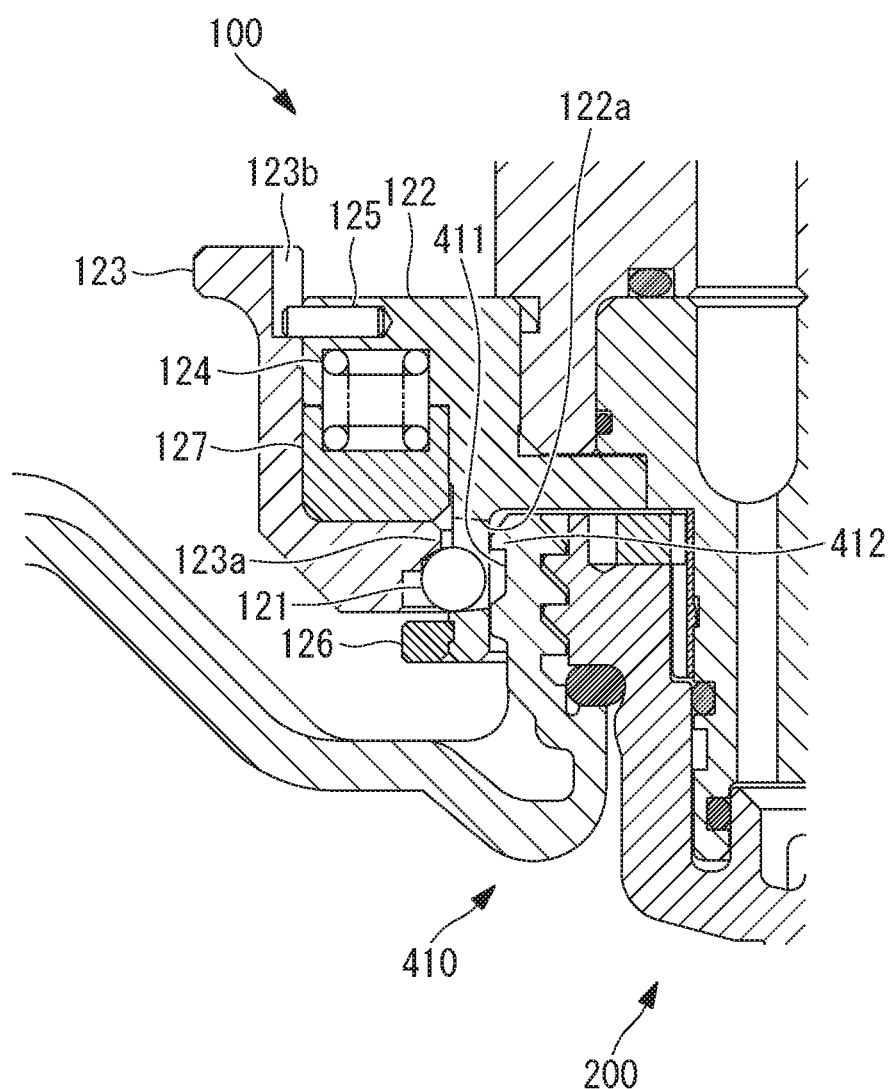
FIG. 4 is a partial longitudinal sectional view showing a ball lock mechanism in a state where a lock ball is not engaged with an engagement groove.

As shown in FIG. 4, when the socket 100 is attached to the opening 410 of the liquid storing container 400, an operator causes the sleeve 123 disposed outside to be pulled upward along the axial line X1 and withdrawn so as to prevent the regulating portion 123*a* of the sleeve 123 from contacting the lock balls 121. In this case, the lock balls 121 are arranged at the location indicated by a solid line so as not to project from the opening hole 122*a*. The operator inserts the socket 100 into the plug 200 and the opening 410 in the state where the sleeve 123 is pulled upward along the axial line X1, so that the state shown in FIG. 4 is obtained.

As shown in FIG. 4, a leading end 412 of the opening 410 has a tapered shape in which the outer diameter of the opening increases at a constant gradient about the axial line X1 in a direction from the upper position to the lower position. Accordingly, even when the lock balls 121 project inward from the opening hole 122*a* when the socket 100 is attached to the opening 410, the lock balls 121 are guided to the outside along the leading end 412 of the opening 410 that has a tapered shape. Thus, a defect in the attachment of the socket 100 to the opening 410 due to the contact between the lock balls 121 and the leading end 412 of the opening 410 is prevented from occurring.

The operator inserts the socket 100 into the plug 200 and removes his/her hand from the sleeve 123 after the state shown in FIG. 4 is obtained, to allow the lock balls 121 to be engaged with the engagement grooves 411 of the opening 410, so that the socket 100 can be fixed to the outer peripheral surface of the opening 410. This is because when the operator removes his/her hand from the sleeve 123, the spring 124 supplies the sleeve 123 with a downward urging force, which allows the sleeve 123 to move to the lower end position where the sleeve is switched to contact with the stop ring 126.

Figure 5:
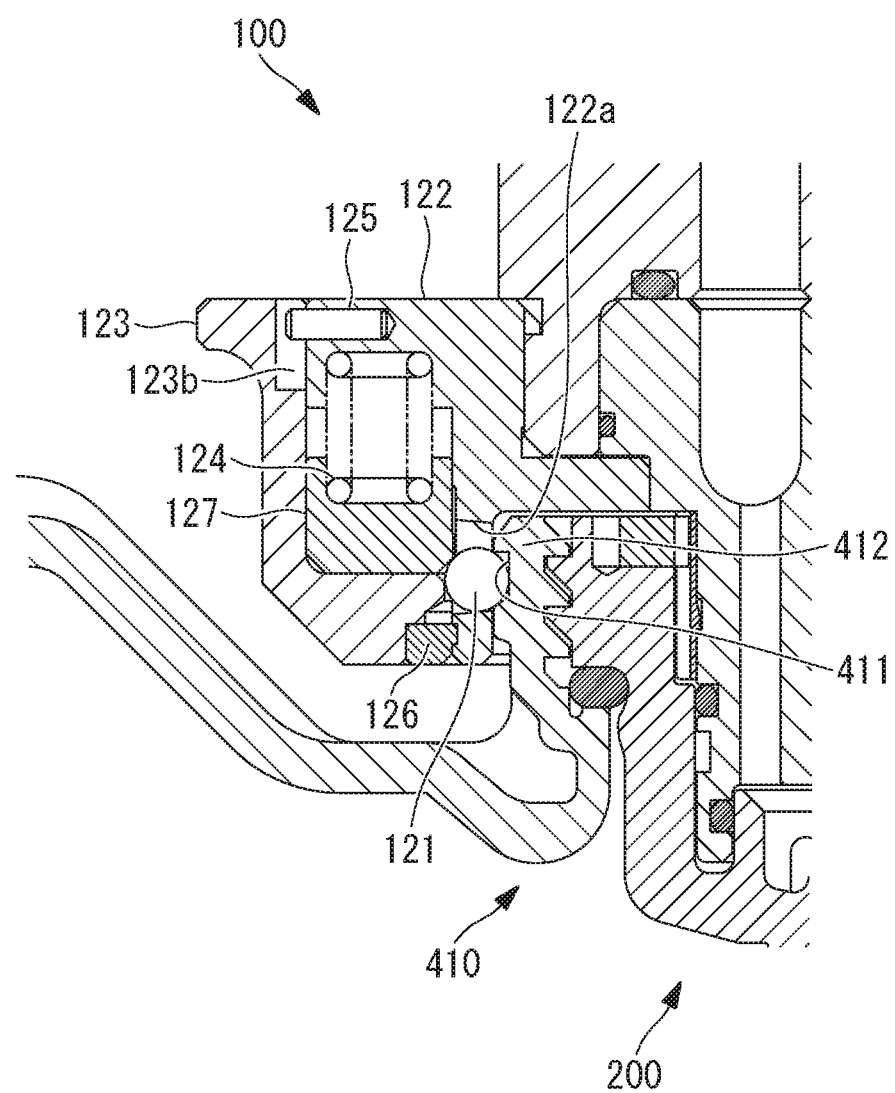
FIG. 5 is a partial longitudinal sectional view showing the ball lock mechanism in a state where the lock ball is engaged with the engagement groove.

As shown in FIG. 5, when the sleeve 123 moves to the lower end position, the regulating portion 123*a* moves to the location in contact with the lock balls 121, so that the plurality of lock balls 121 are fixed to the engagement grooves 411.

Next, another aspect of the operation for fixing the socket 100 to the opening 410 of the liquid storing container 400 by using the lock ball mechanism 120. In this aspect, the socket 100 is pressed into the plug 200 to attach the socket 100 to the plug 200 at a single touch, without the need for the operator to touch the sleeve 123.

When the socket 100 is attached to the opening 410 of the liquid storing container 400 with the plug 200 fixed to the inner peripheral surface thereof, the operator presses the socket 100 into the plug 200, without touching the sleeve 123, so that the sleeve 123 is pressed upward against the urging force of the spring 124 and the lock balls 121 are withdrawn.

Further, the operator presses the socket 100 into the plug 200 until the lock balls 121 reach the position of the engagement grooves 411, so that the lock balls 121 are fixed to the engagement grooves 411 by the urging force of the spring 124. Thus, the operator can allow the socket 100 to be fixed to the outer peripheral surface of the opening 410, without the need for any troublesome work.

Figure 6:
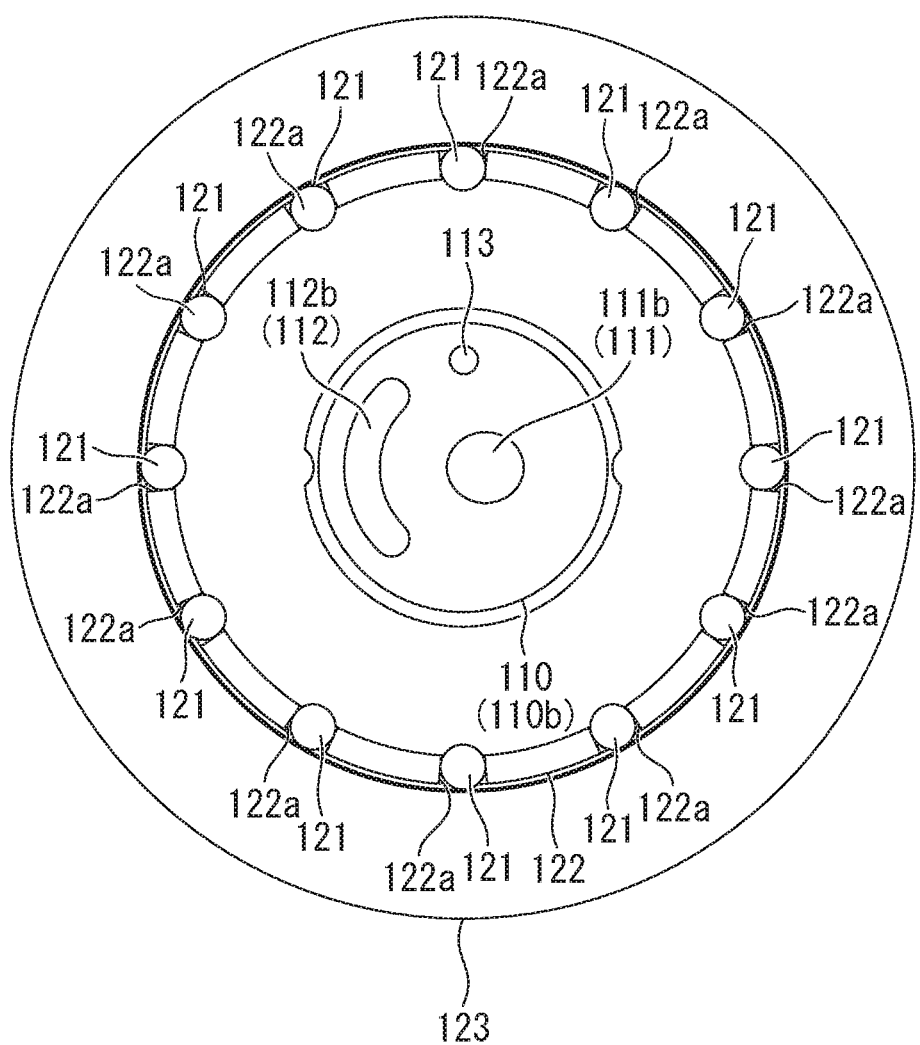
FIG. 6 is a sectional view of the socket as viewed along a line A-A shown in FIG. 3.

As shown in FIG. 6 (a sectional view of the socket as viewed along a line A-A shown in FIG. 3), in the state where the plurality of lock balls 121 are fixed to the engagement grooves 411, the plurality of lock balls 121 project inward from the opening hole 122*a*. The portions of the plurality of lock balls 121 that project inward from the opening hole 122*a* correspond to the portions to be engaged with the engagement grooves 411.

The switching mechanism 140 is a mechanism to be connected to the rotary valve 130 to be described later, and rotates the rotary valve about the axial line X2, thereby switching the rotary valve 130 to the open state or the closed state.

The open state of the rotary valve 130 refers to a state in which, as shown in FIG. 3, an outflow through-hole 131, which is formed in the rotary valve 130, and the second liquid outflow passage 111 of the socket body 110 communicate with each other and an inflow through-hole 132, which is formed in the rotary valve 130, and the second liquid inflow passage 112 of the socket body 110 communicate with each other.

The closed state of the rotary valve 130 refers to a state in which, as shown in FIG. 2, the outflow through-hole 131 formed in the rotary valve 130 and the second liquid outflow passage 111 of the socket body 110 do not communicate with each other and the inflow through-hole 132 formed in the rotary valve 130 and the second liquid inflow passage 112 of the socket body 110 do not communicate with each other.

The switching mechanism 140 includes a pair of lock cams (lock members) 141, which are connected to both ends of the rotary valve 130, and an opening/closing arm 142 that connects the pair of lock cams 141 and accepts an opening/closing operation by the operator.

The operator fixes the plug 200 to the inner peripheral surface of the opening 410 to attach the socket 100 to the outer peripheral surface of the opening 410. After that, the operator grips the leading end of the opening/closing arm 142 shown in FIG. 7 and allows the opening/closing arm 142 to rotate clockwise (in a direction indicated by an arrow shown in FIG. 7) about the axial line X2. This allows the rotary valve 130 to be switched from the closed state shown in FIG. 7 to the open state shown in FIG. 8.

Figure 7:
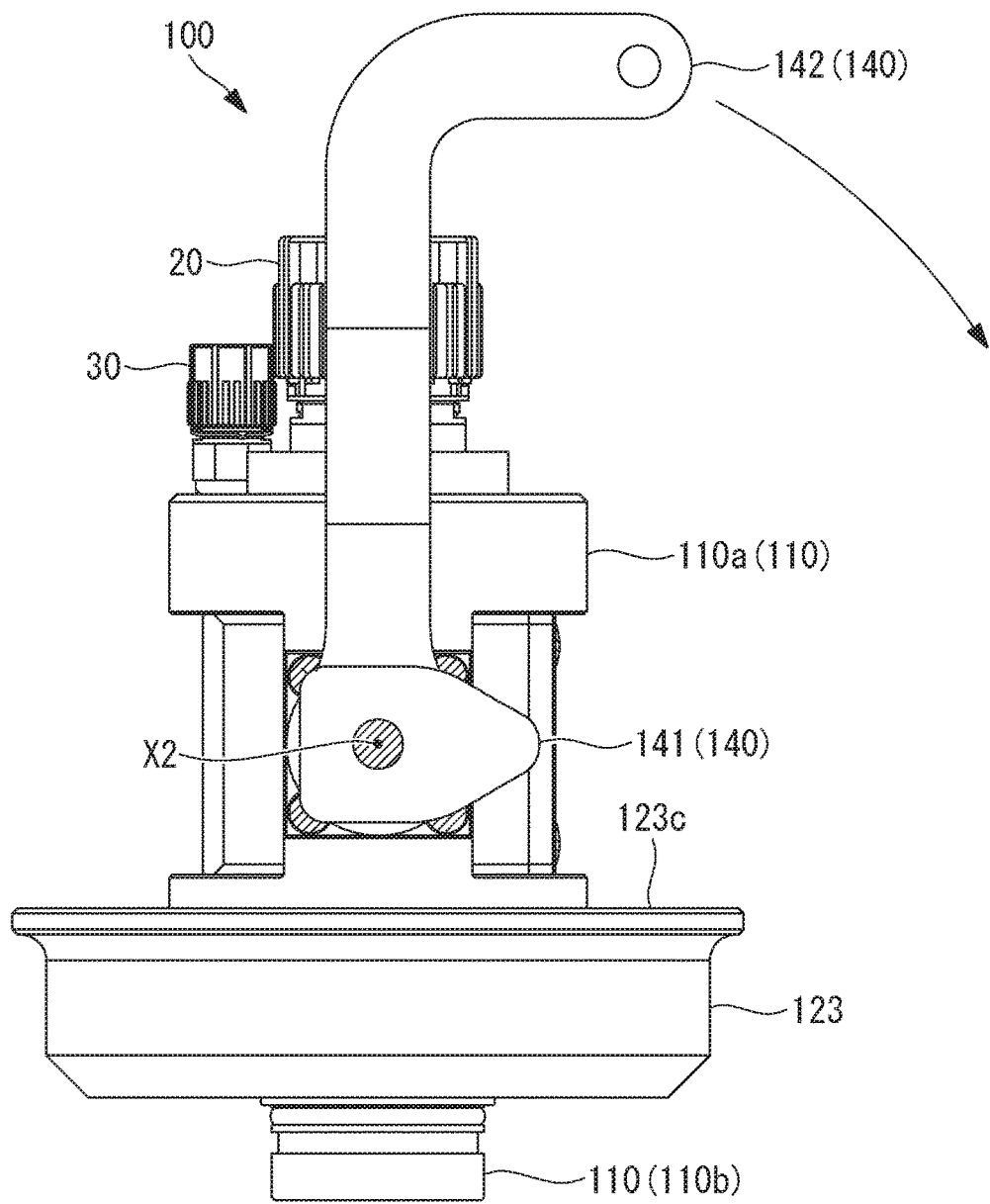
FIG. 7 is a left side view of the socket shown in FIG. 2.
Figure 8:
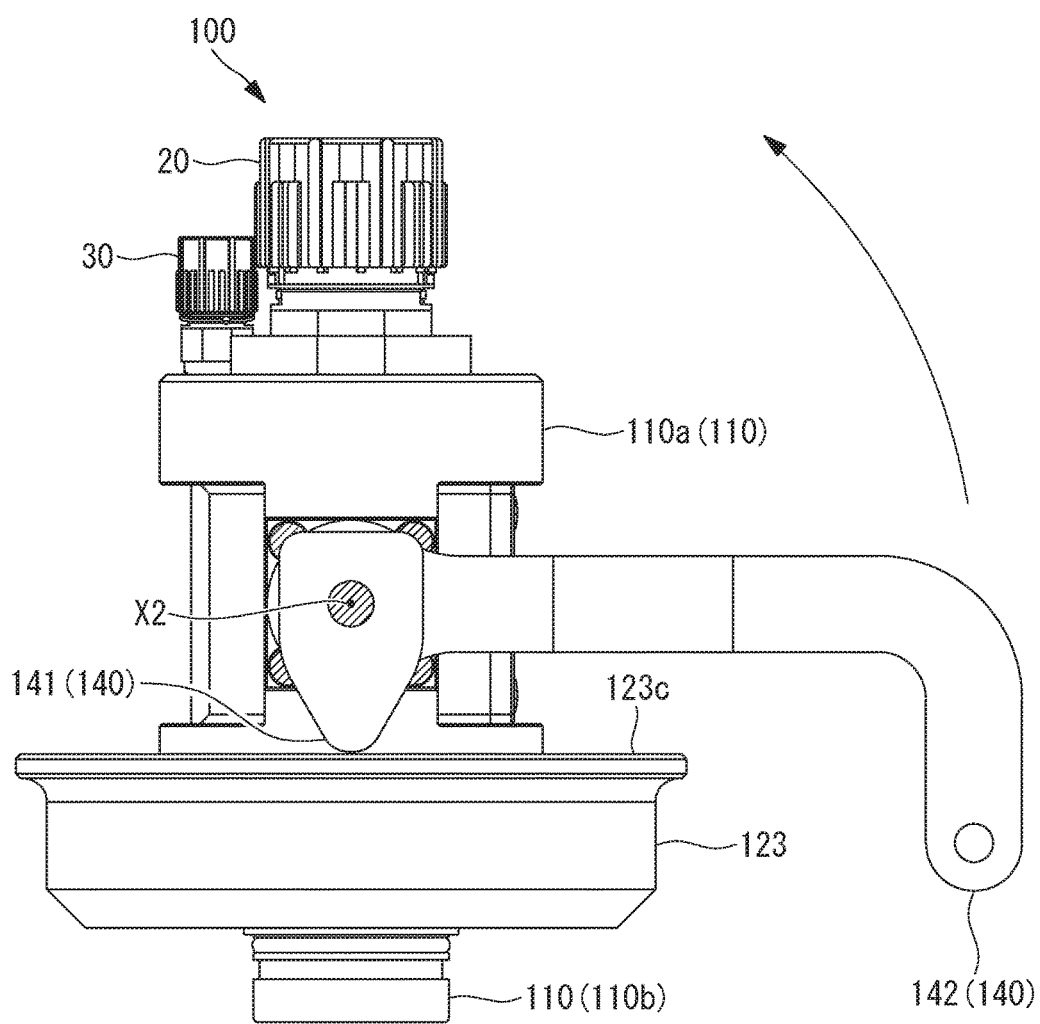
FIG. 8 is a left side view of the socket shown in FIG. 3.

On the other hand, the operator grips the leading end of the opening/closing arm 142 shown in FIG. 8 and allows the opening/closing arm 142 to rotate counterclockwise (in a direction indicated by an arrow shown in FIG. 8) about the axial line X2. This allows the rotary valve 130 to be switched from the open state shown in FIG. 8 to the closed state shown in FIG. 7.

The operator switches the opening/closing arm 142 from the state shown in FIG. 7 to the state shown in FIG. 8, thereby switching the state from a lock release state in which the lock cams 141 are not in contact with an upper surface 123c of the sleeve 123 to a lock state in which the lock cams 141 are in contact with the upper surface 123c of the sleeve 123.

Note that in the lock state, the lock cams 141 need not necessarily be in contact with the upper surface 123c of the sleeve 123. The lock state includes a state in which the lower end of each lock cam 141 is disposed at a location near the upper surface 123c of the sleeve 123 and an upward movement of the sleeve 123 is regulated.

In the lock state, the operator cannot release the state in which the sleeve 123 is pulled upward and the lock ball mechanism 120 is fixed to the opening 410. This is because the upper surface 123c of the sleeve 123 is in contact with the lock cams 141 and the upward movement of the sleeve 123 along the axial line X1 is regulated.

Thus, in the socket 100 according to this embodiment, when the rotary valve 130 is in the open state, the upward movement of the sleeve 123 along the axial line X1 is regulated, thereby making it possible to reliably prevent the outflow of the liquid to the outside due to an incorrect operation or the like.

As shown in FIG. 3, the rotary valve 130 is a member that is formed with a columnar shape along the axial line X2 perpendicular to the axial line X1. The rotary valve 130 includes the outflow through-hole 131, which is formed at the location where the second liquid outflow passage 111 on the axial line X2 is disposed, and the inflow through-hole 132 which is formed at the location where the second liquid inflow passage 112 is disposed on the axial line X2.

The rotary valve 130 is inserted into the insert hole 114, which is formed in the socket body 110, so as to be rotatable about the axial line X2. The insert hole 114 is formed along the axial line X2 so as to penetrate through the second liquid outflow passage 111. The second liquid outflow passage 111 is divided into an upstream-side outflow passage 111b and a downstream-side outflow passage 111a by the insert hole 114. The insert hole 114 is formed along the axial line X2 so as to penetrate through the second liquid inflow passage 112. The second liquid inflow passage 112 is divided into an upstream-side inflow passage 112a and a downstream-side inflow passage 112b by the insert hole 114.

The circulation state of each passage of the socket 100 when the rotary valve 130 is in the closed state will now be described.

Figure 9:
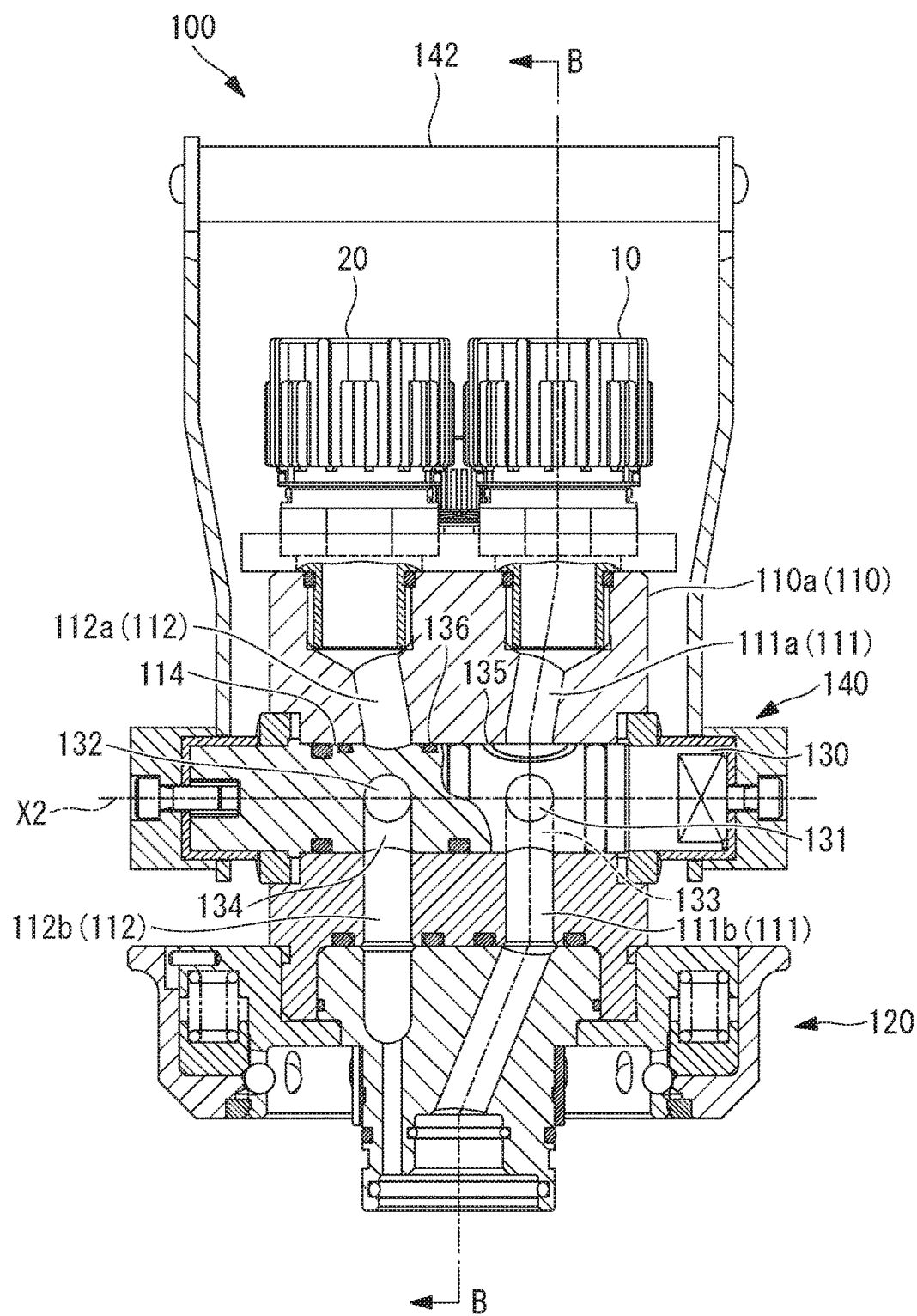
FIG. 9 is a partial longitudinal sectional view of the socket shown in FIG. 2.

As shown in FIGS. 9 and 10, the rotary valve 130 includes: a discharge hole (first discharge hole) 133 having one end opened to the outer peripheral surface of the rotary valve 130 and the other end opened to the outflow through-hole 131, and a discharge hole (second discharge hole) 134 having one end opened to the outer peripheral surface of the rotary valve 130 and the other end opened to the inflow through-hole 132.

The discharge hole 133 is a hole for discharging the liquid remaining in the outflow through-hole 131 to the upstream-side outflow passage 111b when the rotary valve 130 is switched from the open state to the closed state. Similarly, the discharge hole 134 is a hole for discharging the liquid remaining in the inflow through-hole 132 to the downstream-side inflow passage 112b when the rotary valve 130 is switched from the open state to the closed state.

An O-ring 135 shown in FIGS. 9 and 10 is a seal member for sealing the space between the outer peripheral surface of the rotary valve 130 and the inner peripheral surface of the insert hole 114 so as to prevent the liquid from flowing into the space from the downstream-side outflow passage 111a when the rotary valve 130 is in the closed state. The O-ring 135 is press-fit into a circular groove formed in the outer peripheral surface of the rotary valve 130.

Similarly, an O-ring 136 shown in FIG. 9 is a seal member for sealing the space between the outer peripheral surface of the rotary valve 130 and the inner peripheral surface of the insert hole 114 so as to prevent the liquid from flowing into the space from the upstream-side inflow passage 112a when the rotary valve 130 is in the closed state. The O-ring 136 is press-fit into a circular groove formed in the outer peripheral surface of the rotary valve 130.

As shown in FIG. 10, the communication member 110c is attached to the first body portion 110a. Further, the plate-like member 110d and the plate-like member 110e are arranged in such a manner that they sandwich the first body portion 110a and the communication member 110c. In a state where a fixture (not shown) penetrates through the first body portion 110a and the communication member 110c, the plate-like member 110d and the plate-like member 110e are fastened with the fixture, so that the communication member 110c is fixed to the first body portion 110a. The fixture for the plate-like member 110d and the plate-like member 110e is preferably formed of a metallic member such as stainless.

As shown in FIGS. 10 and 11, the communication member 110c has a communication hole 115 formed therein. The communication hole 115 is a hole that allows the outflow through-hole 131 and the inflow through-hole 132 to communicate with each other when the rotary valve 130 is in the closed state. The formation of the communication hole 115 allows the upstream-side outflow passage 111b and the discharge hole 133 to communicate with each other, allows the outflow through-hole 131 and the inflow through-hole 132 to communicate with each other, and allows the discharge hole 134 and the downstream-side inflow passage 112b to communicate with each other, when the rotary valve 130 is in the closed state.

Next, the circulation state of each passage of the socket 100 when the rotary valve 130 is in the open state will be described.

Figure 12:
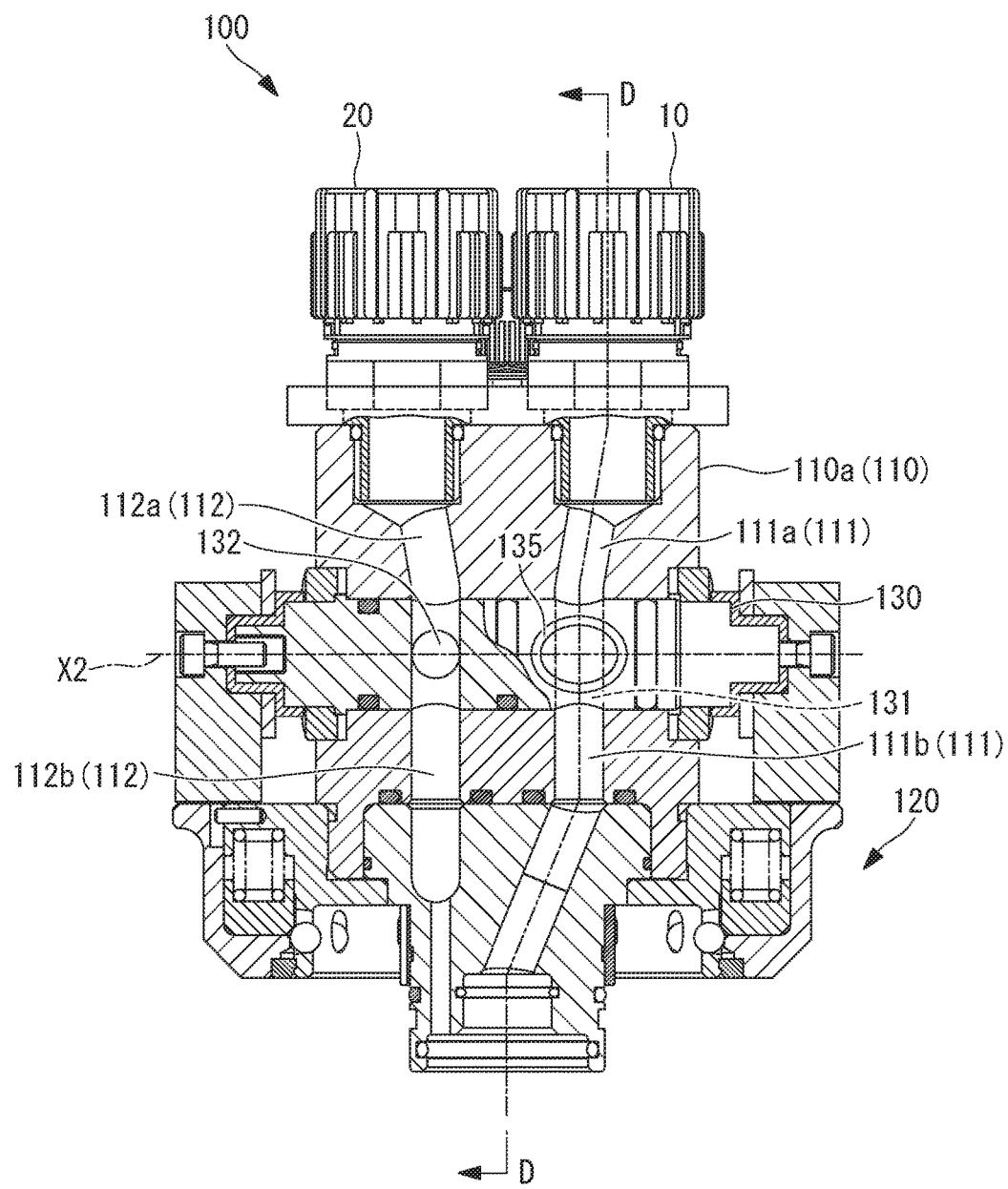
FIG. 12 is a partial longitudinal sectional view of the socket shown in FIG. 3.
Figure 13:
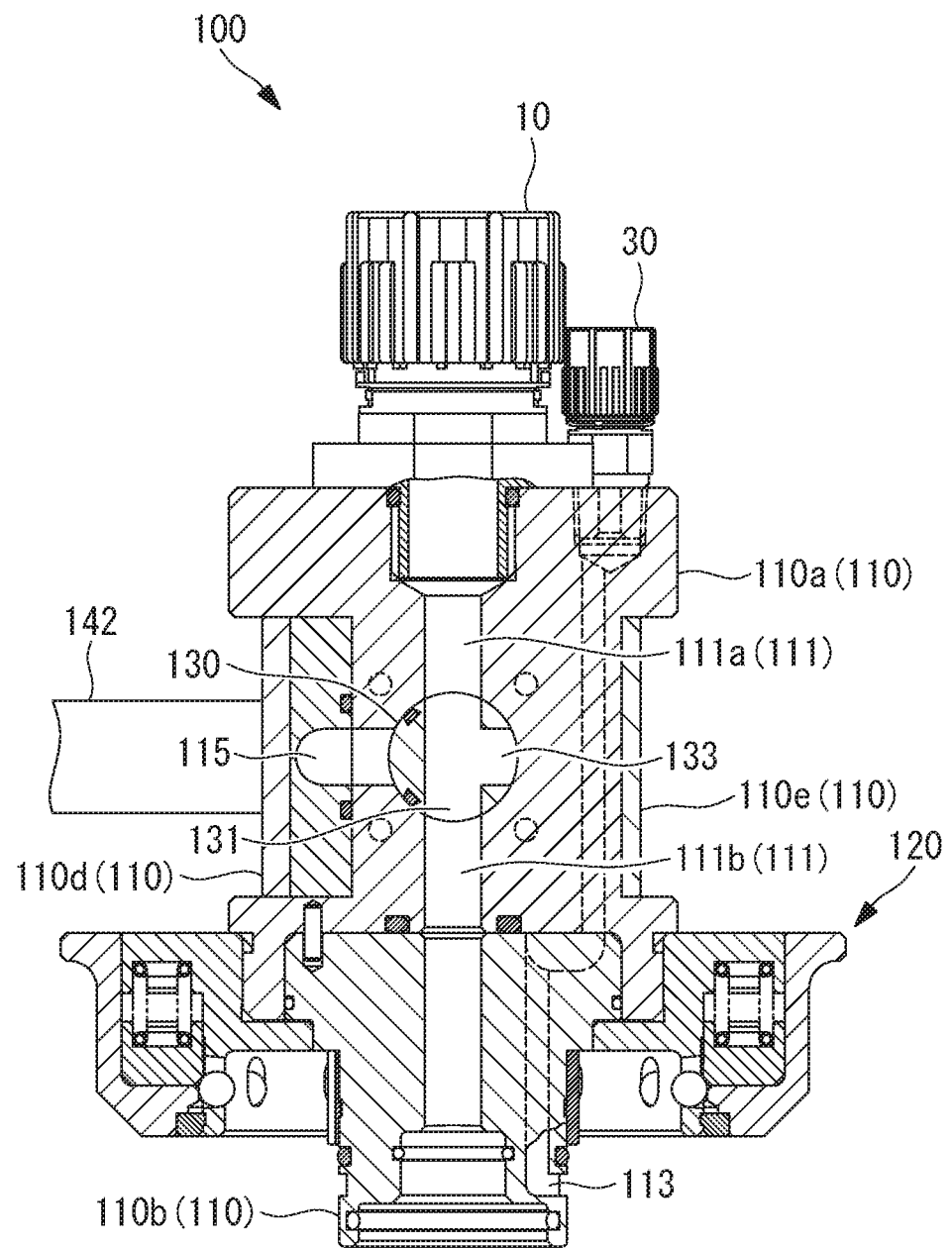
FIG. 13 is a partial sectional view of the socket as viewed along a line D-D shown in FIG. 12.

As shown in FIGS. 12 and 13, when the rotary valve 130 is in the open state, the outflow through-hole 131, the upstream-side outflow passage 111b, and the downstream-side outflow passage 111a communicate with each other, and the inflow through-hole 132, the upstream-side inflow passage 112a, and the downstream-side inflow passage 112b communicate with each other.

As shown in FIGS. 12 and 13, when the rotary valve 130 is in the open state, the outflow through-hole 131 and the communication hole 115 do not communicate with each other. Similarly, when the rotary valve 130 is in the open state, the inflow through-hole 132 and the communication hole 115 do not communicate with each other.

Figure 14:
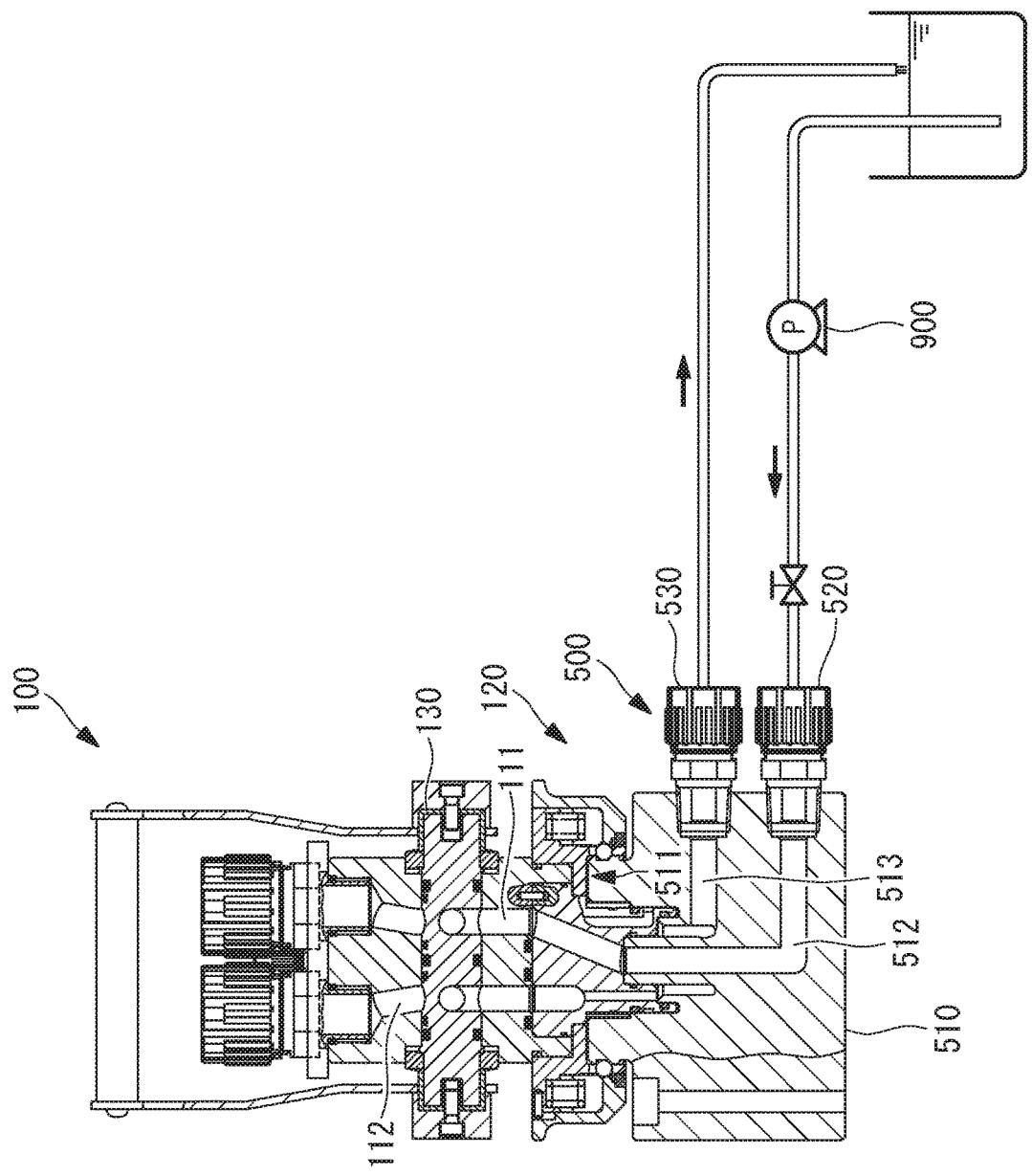
FIG. 14 is a structural diagram showing a socket cleaning system.

Next, the socket cleaning device 500 that cleans the socket 100 according to this embodiment will be described with reference to FIG. 14.

The socket cleaning device 500 is a device for cleaning the liquid remaining in the socket 100 when the rotary valve 130 is in the closed state. The socket cleaning device 500 includes a body portion 510, an inflow port 520, and a discharge port 530.

The body portion 510 includes an opening 511 to which the socket 100 is attached, an inflow passage 512 that communicates with the second liquid outflow passage 111 in the state where the socket 100 is attached, and an outflow passage 513 that communicates with the second liquid inflow passage 112 in the state where the socket 100 is attached.

An engagement groove is formed in the outer peripheral surface of the opening 511. The lock ball mechanism 120 of the socket 100 can be fixed to the engagement groove.

The socket 100 is attached to the opening 511 of the socket cleaning device 500 and the rotary valve 130 is switched to the closed state, as shown in FIG. 9, so that the second liquid outflow passage 111 and the second liquid inflow passage 112 communicate with each other via the communication hole 115. When the liquid for cleaning (such as purified water) is supplied from a supply source to the inflow port 520 by the pump 900 while the rotary valve 130 is kept in the closed state, the liquid flows in from the inflow passage 512 to the second liquid outflow passage 111. The liquid flowing into the second liquid outflow passage 111 flows into the second liquid inflow passage 112 via the communication hole 115 and is guided to the outflow passage 513. The liquid guided to the outflow passage 513 flows out from the discharge port 530 and is returned to the supply source again.

The socket cleaning device 500 circulates the cleaning solution in the socket 100 in the manner as described above, thereby cleaning the upstream-side outflow passage 111b, the discharge hole 133, the outflow through-hole 131, the inflow through-hole 132, the discharge hole 134, the downstream-side inflow passage 112b, and the communication hole 115 of the socket 100.

The operation and effect provided by the connector 300 according to the embodiment described above will be described.

According to the connector 300 of this embodiment, the liquid is sucked by the pump 600 in the state where the socket 100 is attached to the plug 200, and thus the liquid drawn out from the first liquid outflow passage 211 of the plug 200 flows to the outside via the second liquid outflow passage 111 of the socket 100. Further, the liquid circulated by the pump 600 is guided from the first liquid inflow passage 212 of the plug 200 into the liquid storing container 400 via the second liquid inflow passage 112 of the socket 100. Furthermore, an outside air to be replaced by an amount corresponding to the decreased amount of liquid stored in the liquid storing container is guided from the outside space S2 of the liquid storing container 400 into the inside space Si thereof via the second gas passage 113 of the socket 100 and the first gas passage 213 of the plug 200.

Thus, the connector 300 according to this embodiment has a structure capable of causing the liquid stored in the liquid storing container 400 to flow to the outside, causing the liquid that has flown to the outside and circulated to flow into the liquid storing container 400, and introducing an outside air corresponding to the decreased amount of liquid stored in the liquid storing container 400.

Further, in the socket 100 included in the connector 300 according to this embodiment, the ball lock mechanism 120 allows the plurality of lock balls 121 to be engaged with the engagement grooves 411, which are formed in the outer peripheral surface of the opening 410 of the liquid storing container 400, and fixes the plurality of lock balls 121 to the engagement grooves 411, thereby making it possible to reliably attach the socket to the plug 200 without requiring any troublesome operation.

According to the connector 300 of this embodiment, when the socket 100 is attached to the opening 410 of the liquid storing container 400 in which the plug 200 is fixed to the inner peripheral surface thereof, the operator causes the sleeve 123 to be pulled upward along the axial line X1 and withdrawn so as to prevent the regulating portion 123a from contacting the lock balls 121. This operation allows the operator to attach the socket 100 to the plug 200 in the state where the locking by the ball lock mechanism 120 is released. Further, the operator detaches the sleeve 123 after attaching the socket 100 to the plug 200, thereby allowing the socket 100 to be fixed to the outer peripheral surface of the opening 410 without requiring any troublesome operation. This is because when the sleeve 123 is detached, the urging force from the spring 124 is applied to the sleeve 123 and the regulating portion 123a moves to the location where the regulating portion 123a contacts the lock balls 121, thereby allowing the plurality of lock balls 121 to be fixed to the engagement grooves 411, respectively.

According to the connector 300 of this embodiment, when the operator attaches the socket 100 to the opening 410 of the liquid storing container 400 in which the plug 200 is fixed to the inner peripheral surface thereof, the operator presses the socket 100 into the plug 200 without touching the sleeve 123, thereby allowing the lock balls 121 to be withdrawn. This is because the force of pressing the socket 100 by the operator becomes a force against the urging force of the spring 124, which causes the sleeve 123 and the spring receiving member 127 in contact with the sleeve 123 to be moved so that the lock balls can be withdrawn.

Further, the operator presses the socket 100 into the plug 200 until the lock balls 121 reach the location of the engagement grooves 411, thereby allowing the lock balls 121 to be fixed to the engagement grooves 411, respectively, by the urging force of the spring 124. This operation allows the operator to fix the socket 100 to the outer peripheral surface of the opening 410 without requiring any troublesome operation.

In the connector 300 of this embodiment, the ball lock mechanism 120 includes the rotation regulating pin 125 that regulates the rotation of the sleeve 123 about the axial line X1 with respect to the socket member 122.

This structure prevents such a defect that the sleeve 123 is rotated about the axial line X1 with respect to the socket member 122 and the urging force applied to the sleeve 123 by the spring 124 changes.

According to the connector 300 of this embodiment, the switching mechanism 140 switches the rotary valve 130 to the open state or the closed state, thereby making it possible to switch between the open state and the closed state. The open state is a state in which the liquid is circulated in the second liquid outflow passage 111 and the second liquid inflow passage 112 via the outflow through-hole 131 and the inflow through-hole 132. The closed state is a state in which the liquid is not circulated in the second liquid outflow passage 111 and the second liquid inflow passage 112 via the outflow through-hole 131 and the inflow through-hole 132.

Accordingly, it is possible to prevent defects, such as the accumulation of solid particles at the section where the passage sectional area decreases locally, which deteriorates the liquidity of the liquid, and such a defect that solid particles adhere to the urging mechanism of the valve body, which makes it difficult to smoothly open or close the valve.

In the connector 300 of this embodiment, the switching mechanism 140 includes the lock cams 141 that regulate an upward movement of the sleeve 123 along the axial line X1 in the open state.

With this structure, the upward movement of the sleeve 123 is regulated in the open state of the rotary valve 130, which prevents the regulating portion 123a from being spaced apart from the lock balls 121 and thus preventing the socket 100 from being detached from the outer peripheral surface of the opening 410. Thus, the outflow of the liquid to the outside due to an erroneous operation or the like can be reliably prevented.

According to the connector 300 of this embodiment, the liquid guided to the first liquid inflow passage 212 formed in the plug body 210 is guided to the annular passage 214, which is formed between the inside pipe 220 and the outside pipe 230, and flows out into the liquid storing container 400 from the outflow hole 231 formed at the lower end 230a of the outside pipe 230. Since the liquid flows out from the outflow hole 231 at the lower end 230a of the outside pipe 230, the liquid flows out in the direction in which the outflow hole 231 is opened, and the liquid in the vicinity of the bottom of the liquid storing container 400 flows favorably. Thus, when the liquid is a slurry containing an abrasive or the like (a slurry in which solid particles are dispersed), the state in which the solid particles and the liquid are favorably mixed in the vicinity of the bottom of the liquid storing container 400 is maintained.

The liquid storing container 400 of this embodiment includes the container body 420 that stores a liquid, and the opening 410 that is provided in an upper surface of the container body 420 and formed with a cylindrical shape about the axial line X1. The liquid storing container 400 is attachable to the connector 300 which includes: the plug 200 to be fixed to the inner peripheral surface of the opening 410; and the socket 100 to be detachably attached to the plug 200. The engagement grooves 411 to be engaged with the plurality of lock balls 121 which are included in the ball lock mechanism 120 provided in the socket 100 are formed in the outer peripheral surface of the opening 410 along the circumferential direction about the axial line X1.

With this structure, it is possible to provide the liquid storing container 400 that allows the socket 100 including the ball lock mechanism 120 to be appropriately engaged.

Other Embodiments

In the above description, the liquid storing container 400 includes the opening 410 formed integrally with the container body 420 as shown in FIG. 1, but instead may have another aspect. For example, the liquid storing container 400 in which a cylindrical member (not shown) formed with a cylindrical shape about the axial line X1 is engaged with the engagement grooves 411 in the outer peripheral surface of the opening 410 formed with a cylindrical shape integrally with the container body 420 may be used. In this case, the cylindrical member includes engagement grooves formed along the circumferential direction about the axial line X1 in the outer peripheral surface. The socket body 110 is fixed to the liquid storing container 400 in such a manner that the plurality of lock balls of the ball lock mechanism 120 are engaged with the engagement grooves of the cylindrical member.

Thus, the opening of the liquid storing container 400 of this embodiment includes the opening 410, which is formed with a cylindrical shape integrally with the container body 420, as well as the cylindrical member to be engaged with the outer peripheral surface of the opening 410.

What is claimed is:

1. A connector to be attached to a liquid storing container having an opening formed in an upper surface thereof, the opening being formed with a cylindrical shape about a first axial line, the connector comprising:
   a plug to be fixed to an inner peripheral surface of the opening; and
   a socket to be detachably attached to the plug, wherein
   the plug includes a plug body including, formed therein, a first liquid outflow passage through which a liquid stored in the liquid storing container is drawn out; a first liquid inflow passage that guides the liquid flowing in from an outside of the liquid storing container into the liquid storing container, the first liquid inflow passage being provided independently from the first liquid outflow passage; and a first gas passage that circulates an outside air between an inside space of the liquid storing container and an outside space of the liquid storing container, and
   the socket includes:
      a socket body including, formed therein, a second liquid outflow passage through which the liquid drawn out from the first liquid outflow passage is caused to flow to the outside; a second liquid inflow passage that guides the liquid flowing in from the outside of the liquid storing container to the first liquid inflow passage; and a second gas passage connected to the first gas passage and causing the outside air to circulate between the inside space of the liquid storing container and the outside space of the liquid storing container; and
      a ball lock mechanism that is attached to the socket body, allows a plurality of lock balls to he engaged with engagement grooves, and fixes the plurality of lock balls to the engagement grooves, respectively, the engagement grooves being formed along a circumferential direction about the first axial line in an outer peripheral surface of the opening.

2. The connector according to claim 1, wherein the ball lock mechanism includes:
   the plurality of lock balls;
   a first cylindrical member having a plurality of opening holes, the opening holes being formed with a cylindrical shape about the first axial line and having a diameter smaller than an outer diameter of each of the lock balls;
   a second cylindrical member that is formed with a cylindrical shape about the first axial line and disposed at an outer peripheral side of the first cylindrical member, the second cylindrical member including a regulating portion that regulates the lock balls stored in the opening holes, respectively, to be engaged with the engagement grooves; and an urging force generation unit that urges the second cylindrical member against a location where the regulating portion contacts the lock balls, one end of the urging force generation unit being formed along the first axial line and fixed to the first cylindrical member, the other end of the urging force generation unit being formed along the first axial line and fixed to the second cylindrical member.

3. The connector according to claim 2, wherein the ball lock mechanism includes a rotation regulating mechanism that regulates a rotation of the second cylindrical member about the first axial line with respect to the first cylindrical member.

4. The connector according to claim 2, wherein the socket body includes a cylindrical insertion hole formed along a second axial line intersecting with the first axial line so as to penetrate through the second liquid outflow passage and the second liquid inflow passage, and the socket includes:

a columnar rotary valve including an outflow through-hole and an inflow through-hole and inserted into the insert hole, the outflow through-hole being formed at a location where the second liquid outflow passage is disposed on the second axial line, the inflow through-hole being formed at a location where the second liquid inflow passage is disposed on the second axial line; and a switching mechanism that switches between an open state and a closed state when the rotary valve is rotated about the second axial line, the open state being a state in which the outflow through-hole and the second liquid outflow passage communicate with each other and the inflow through-hole and the second liquid inflow passage communicate with each other, the closed state being a state in which the outflow through-hole and the second liquid outflow passage do not communicate with each other and the inflow through-hole and the second liquid inflow passage do not communicate with each other.

5. The connector according to claim 4, wherein the switching mechanism includes a lock member that regulates an upward movement of the second cylindrical member along the first axial line in the open state.

6. The connector according to claim 1, wherein the plug includes:

a cylindrical inside pipe that is attached to a lower portion of the plug body and guides the liquid stored in the liquid storing container to the first liquid outflow passage;

a cylindrical outside pipe that is attached to the plug body, is disposed at an outside of the inside pipe, and forms an annular passage to guide the liquid guided to the first liquid inflow passage into the liquid storing container; and a sealing member that seals a space between an outer peripheral surface of the inside pipe and an inner peripheral surface at a second lower end of the outside pipe, the second lower end being disposed above a first lower end of the inside pipe, and an outflow hole through which the liquid is caused to flow out into the liquid storing container from the annular passage is formed at the second lower end of the outside pipe.

7. A socket to be attached to a liquid storing container having an opening formed in an upper surface thereof, the opening being formed with a cylindrical shape about an axial line, the socket comprising:

a socket body including, formed therein, a liquid outflow passage that causes a liquid drawn out from a plug to be fixed to an inner peripheral surface of the opening to flow to an outside of the liquid storing container; a liquid inflow passage that guides the liquid flowing in from the outside of the liquid storing container to the plug, the liquid inflow passage being provided independently from the liquid outflow passage; and a gas passage that circulates an outside air between an inside space of the liquid storing container and an outside space of the liquid storing container; and a ball lock mechanism that allows a plurality of lock balls to be engaged with engagement grooves and fixes the plurality of lock balls to the engagement grooves, respectively, the engagement grooves being formed along a circumferential direction about the axial line in an outer peripheral surface of the opening.

8. A liquid storing container comprising:

a container body that stores a liquid; and an opening that is provided in an upper surface of the container body and formed with a cylindrical shape about an axial line, the liquid storing container being attachable to a connector according to claim 1, the connector including: a plug to be fixed to an inner peripheral surface of the opening; and a socket to be detachably attached to the plug, wherein engagement grooves to be engaged with a plurality of lock halls are formed along a circumferential direction about the axial line in an outer peripheral surface of the opening, the plurality of lock balls being included in a ball lock mechanism provided in the socket.

* * * * *